US006998579B2

(12) United States Patent
Inagawa et al.

(10) Patent No.: US 6,998,579 B2
(45) Date of Patent: Feb. 14, 2006

(54) CHAMBER FOR UNIFORM SUBSTRATE HEATING

(75) Inventors: Makoto Inagawa, Palo Alto, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/736,202

(22) Filed: Dec. 15, 2003

(65) Prior Publication Data

US 2004/0149716 A1 Aug. 5, 2004

Related U.S. Application Data

(63) Continuation-in-part of application No. 10/025,152, filed on Dec. 18, 2001, now Pat. No. 6,765,178.
(60) Provisional application No. 60/434,064, filed on Dec. 17, 2002, and provisional application No. 60/259,035, filed on Dec. 29, 2000.

(51) Int. Cl.
*F27B 5/14* (2006.01)

(52) U.S. Cl. ........................ 219/390; 219/405; 219/411; 118/724; 118/725; 118/50.1; 392/416; 392/418
(58) Field of Classification Search ................ 219/390, 219/405, 411, 392, 409; 392/416, 418; 118/724, 118/725, 50.1
See application file for complete search history.

(56) References Cited

U.S. PATENT DOCUMENTS 3,862,397 A   1/1975  Anderson et al. ........... 219/405

| 4,058,430 A | 11/1977 | Suntola et al. ............. 156/611 |
| 4,389,973 A | 6/1983 | Suntola et al. ............. 118/725 |
| 4,413,022 A | 11/1983 | Suntola et al. ........... 427/255.2 |

(Continued)

FOREIGN PATENT DOCUMENTS

| DE | 196 27 017 | 1/1997 |
| DE | 198 20 147 | 7/1999 |
| EP | 0 344 352 A1 | 12/1989 |
| EP | 0 429 270 A2 | 5/1991 |
| EP | 0 442 490 A1 | 8/1991 |

(Continued)

OTHER PUBLICATIONS

Hultman, et al., "Review of the thermal and mechanical stability of TiN–based thin films", *Zeitschrift Fur Metallkunde*, 90(10) (Oct. 1999), pp. 803–813.

(Continued)

*Primary Examiner*—Shawntina Fuqua
(74) *Attorney, Agent, or Firm*—Dugan & Dugan

(57) ABSTRACT

In a first aspect, a first apparatus is provided for heating substrates. The first apparatus includes (1) a chamber having a bottom portion and a top portion; (2) a plurality of heated supports disposed within the chamber to support at least two substrates thereon; and (3) a heater disposed within the chamber between a sidewall of the chamber and the plurality of substrate supports and having an edge region and a center region. The heater is adapted to produce more heat within the edge region than within the center region of the heater. Numerous other aspects are provided.

40 Claims, 14 Drawing Sheets

U.S. PATENT DOCUMENTS

| | | | | |
|---|---|---|---|---|
| 4,486,487 A | 12/1984 | Skarp | | 428/216 |
| 4,767,494 A | 8/1988 | Kobayashi et al. | | 156/606 |
| 4,783,983 A | 11/1988 | Narasimhan | | 72/204 |
| 4,806,321 A | 2/1989 | Nishizawa et al. | | 422/245 |
| 4,813,846 A | 3/1989 | Helms | | 414/744.1 |
| 4,829,022 A | 5/1989 | Kobayashi et al. | | 437/107 |
| 4,834,831 A | 5/1989 | Nishizawa et al. | | 156/611 |
| 4,838,983 A | 6/1989 | Schumaker et al. | | 156/613 |
| 4,838,993 A | 6/1989 | Aoki et al. | | 156/643 |
| 4,840,921 A | 6/1989 | Matsumoto | | 437/89 |
| 4,845,049 A | 7/1989 | Sunakawa | | 437/81 |
| 4,859,625 A | 8/1989 | Matsumoto | | 437/81 |
| 4,859,627 A | 8/1989 | Sunakawa | | 437/81 |
| 4,861,417 A | 8/1989 | Mochizuki et al. | | 156/610 |
| 4,876,218 A | 10/1989 | Pessa et al. | | 437/107 |
| 4,917,556 A | 4/1990 | Stark et al. | | 414/217 |
| 4,927,670 A | 5/1990 | Erbil | | 427/255.3 |
| 4,931,132 A | 6/1990 | Aspnes et al. | | 156/601 |
| 4,951,601 A | 8/1990 | Maydan et al. | | 118/719 |
| 4,960,720 A | 10/1990 | Shimbo | | 437/105 |
| 4,975,252 A | 12/1990 | Nishizawa et al. | | 422/245 |
| 4,993,357 A | 2/1991 | Scholz | | |
| 5,000,113 A | 3/1991 | Wang et al. | | 118/723 |
| 5,013,683 A | 5/1991 | Petroff et al. | | 437/110 |
| 5,028,565 A | 7/1991 | Chang et al. | | 437/192 |
| 5,082,798 A | 1/1992 | Arimoto | | 437/108 |
| 5,085,885 A | 2/1992 | Foley et al. | | 477/38 |
| 5,091,320 A | 2/1992 | Aspnes et al. | | 437/8 |
| 5,130,269 A | 7/1992 | Kitahara et al. | | 437/111 |
| 5,166,092 A | 11/1992 | Mochizuki et al. | | 437/105 |
| 5,173,474 A | 12/1992 | Connell et al. | | 505/1 |
| 5,186,718 A | 2/1993 | Tepman et al. | | 29/25.01 |
| 5,205,077 A | 4/1993 | Wittstock | | 51/165 R |
| 5,225,366 A | 7/1993 | Yoder | | 437/108 |
| 5,234,561 A | 8/1993 | Randhawa et al. | | 204/192.38 |
| 5,246,536 A | 9/1993 | Nishizawa et al. | | 156/610 |
| 5,250,148 A | 10/1993 | Nishizawa et al. | | 156/611 |
| 5,254,207 A | 10/1993 | Nishizawa et al. | | 156/601 |
| 5,256,244 A | 10/1993 | Ackerman | | 156/613 |
| 5,259,881 A | 11/1993 | Edwards et al. | | 118/719 |
| 5,270,247 A | 12/1993 | Sakuma et al. | | 437/133 |
| 5,278,435 A | 1/1994 | Van Hove et al. | | 257/184 |
| 5,281,274 A | 1/1994 | Yoder | | 118/697 |
| 5,286,296 A | 2/1994 | Sato et al. | | 118/719 |
| 5,290,748 A | 3/1994 | Knuuttila et al. | | 502/228 |
| 5,294,286 A | 3/1994 | Nishizawa et al. | | 156/610 |
| 5,296,403 A | 3/1994 | Nishizawa et al. | | 437/133 |
| 5,300,186 A | 4/1994 | Kitahara et al. | | 156/613 |
| 5,311,055 A | 5/1994 | Goodman et al. | | 257/593 |
| 5,316,615 A | 5/1994 | Copel et al. | | 117/95 |
| 5,316,793 A | 5/1994 | Wallace et al. | | 427/248.1 |
| 5,330,610 A | 7/1994 | Eres et al. | | 117/86 |
| 5,336,324 A | 8/1994 | Stall et al. | | 118/719 |
| 5,338,389 A | 8/1994 | Nishizawa et al. | | 117/89 |
| 5,348,911 A | 9/1994 | Jurgensen et al. | | 117/91 |
| 5,374,570 A | 12/1994 | Nasu et al. | | 437/40 |
| 5,395,791 A | 3/1995 | Cheng et al. | | 437/105 |
| 5,438,952 A | 8/1995 | Otsuka | | 117/84 |
| 5,439,876 A | 8/1995 | Graf et al. | | 505/447 |
| 5,441,703 A | 8/1995 | Jurgensen | | 422/129 |
| 5,443,033 A | 8/1995 | Nishizawa et al. | | 117/86 |
| 5,443,647 A | 8/1995 | Aucoin et al. | | 118/723 ME |
| 5,455,072 A | 10/1995 | Bension et al. | | 427/255.7 |
| 5,458,084 A | 10/1995 | Thorne et al. | | 117/97 |
| 5,469,806 A | 11/1995 | Mochizuki et al. | | 117/97 |
| 5,480,818 A | 1/1996 | Matsumoto et al. | | 437/40 |
| 5,483,919 A | 1/1996 | Yokoyama et al. | | 117/89 |
| 5,484,664 A | 1/1996 | Kitahara et al. | | 428/641 |
| 5,503,875 A | 4/1996 | Imai et al. | | 427/255.3 |
| 5,521,126 A | 5/1996 | Okamura et al. | | 437/235 |
| 5,527,733 A | 6/1996 | Nishizawa et al. | | 437/160 |
| 5,532,511 A | 7/1996 | Nishizawa et al. | | 257/627 |
| 5,540,783 A | 7/1996 | Eres et al. | | 118/725 |
| 5,561,735 A | 10/1996 | Camm | | 392/416 |
| 5,567,152 A | 10/1996 | Morimoto | | 432/241 |
| 5,580,380 A | 12/1996 | Liu et al. | | 117/86 |
| 5,601,651 A | 2/1997 | Watabe | | 118/715 |
| 5,609,689 A | 3/1997 | Kato et al. | | 118/719 |
| 5,616,024 A | 4/1997 | Nobori et al. | | |
| 5,616,181 A | 4/1997 | Yamamoto et al. | | 118/723 ER |
| 5,626,680 A | * 5/1997 | Porter et al. | | 118/725 |
| 5,637,530 A | 6/1997 | Gaines et al. | | 114/105 |
| 5,641,984 A | 6/1997 | Aftergut et al. | | 257/433 |
| 5,644,128 A | 7/1997 | Wollnik et al. | | 250/251 |
| 5,656,093 A | 8/1997 | Burkhart et al. | | |
| 5,667,592 A | 9/1997 | Boitnott et al. | | 118/719 |
| 5,674,786 A | 10/1997 | Turner et al. | | 437/225 |
| 5,693,139 A | 12/1997 | Nishizawa et al. | | 117/89 |
| 5,695,564 A | 12/1997 | Imahashi | | 118/719 |
| 5,705,224 A | 1/1998 | Murota et al. | | 427/248.1 |
| 5,707,880 A | 1/1998 | Aftergut et al. | | 437/3 |
| 5,711,811 A | 1/1998 | Suntola et al. | | 118/711 |
| 5,730,801 A | 3/1998 | Tepman et al. | | 118/719 |
| 5,730,802 A | 3/1998 | Ishizumi et al. | | 118/719 |
| 5,747,113 A | 5/1998 | Tsai | | 427/255.5 |
| 5,749,974 A | 5/1998 | Habuka et al. | | 118/725 |
| 5,788,447 A | 8/1998 | Yonemitsu et al. | | 414/217 |
| 5,788,799 A | 8/1998 | Steger et al. | | 156/345 |
| 5,796,116 A | 8/1998 | Nakata et al. | | 257/66 |
| 5,801,634 A | 9/1998 | Young et al. | | 340/635 |
| 5,807,792 A | 9/1998 | Ilg et al. | | 438/758 |
| 5,817,156 A | 10/1998 | Tateyama et al. | | |
| 5,830,270 A | 11/1998 | McKee et al. | | 117/106 |
| 5,835,677 A | 11/1998 | Li et al. | | 392/401 |
| 5,850,071 A | * 12/1998 | Makiguchi et al. | | 219/390 |
| 5,850,571 A | 12/1998 | Odom et al. | | |
| 5,851,849 A | 12/1998 | Comizzoli et al. | | 438/38 |
| 5,855,675 A | 1/1999 | Doering et al. | | 118/719 |
| 5,855,680 A | 1/1999 | Soininen et al. | | 118/719 |
| 5,856,219 A | 1/1999 | Naito et al. | | 438/241 |
| 5,858,102 A | 1/1999 | Tsai | | 118/719 |
| 5,866,213 A | 2/1999 | Foster et al. | | 427/573 |
| 5,866,795 A | 2/1999 | Wang et al. | | 73/1.36 |
| 5,879,459 A | 3/1999 | Gadgil et al. | | 118/715 |
| 5,882,165 A | 3/1999 | Maydan et al. | | 414/217 |
| 5,882,413 A | 3/1999 | Beaulieu et al. | | 118/719 |
| 5,904,565 A | 5/1999 | Nguyen et al. | | 438/687 |
| 5,916,365 A | 6/1999 | Sherman | | 117/92 |
| 5,923,056 A | 7/1999 | Lee et al. | | 257/192 |
| 5,923,985 A | 7/1999 | Aoki et al. | | 438/301 |
| 5,925,574 A | 7/1999 | Aoki et al. | | 437/31 |
| 5,928,389 A | 7/1999 | Jevtic | | 29/25.01 |
| 5,942,040 A | 8/1999 | Kim et al. | | 118/726 |
| 5,947,710 A | 9/1999 | Cooper et al. | | 418/63 |
| 5,972,430 A | 10/1999 | DiMeo, Jr. et al. | | 427/255.32 |
| 6,001,669 A | 12/1999 | Gaines et al. | | 438/102 |
| 6,015,590 A | 1/2000 | Suntola et al. | | 427/255.23 |
| 6,025,627 A | 2/2000 | Forbes et al. | | 257/321 |
| 6,035,101 A | 3/2000 | Sajoto et al. | | |
| 6,036,773 A | 3/2000 | Wang et al. | | 117/97 |
| 6,042,652 A | 3/2000 | Hyun et al. | | 118/719 |
| 6,043,177 A | 3/2000 | Falconer et al. | | 502/4 |
| 6,046,439 A | 4/2000 | Johnsgard et al. | | 219/444.1 |
| 6,051,286 A | 4/2000 | Zhao et al. | | 427/576 |
| 6,062,798 A | 5/2000 | Muka | | 414/416 |
| 6,071,808 A | 6/2000 | Merchant et al. | | 438/633 |
| 6,072,163 A | 6/2000 | Armstrong et al. | | 219/497 |
| 6,084,302 A | 7/2000 | Sandhu | | 257/751 |
| 6,086,677 A | 7/2000 | Umotoy et al. | | 118/715 |
| 6,110,556 A | 8/2000 | Bang et al. | | 428/64.1 |
| 6,113,977 A | 9/2000 | Soininen et al. | | 427/64 |

| | | | | | | |
|---|---|---|---|---|---|---|
| 6,117,244 A | 9/2000 | Bang et al. ............... 118/715 | | JP | 61-210623 | 9/1986 |
| 6,124,158 A | 9/2000 | Dautartas et al. ........... 438/216 | | JP | 62-069508 | 3/1987 |
| 6,130,147 A | 10/2000 | Major et al. ............... 438/604 | | JP | 62-091495 A | 4/1987 |
| 6,139,700 A | 10/2000 | Kang et al. ............ 204/192.17 | | JP | 62-141717 | 6/1987 |
| 6,140,237 A | 10/2000 | Chan et al. ............... 438/687 | | JP | 62-167297 | 7/1987 |
| 6,140,238 A | 10/2000 | Kitch ...................... 438/687 | | JP | 62-171999 | 7/1987 |
| 6,143,659 A | 11/2000 | Leem ....................... 438/688 | | JP | 62-232919 | 10/1987 |
| 6,144,060 A | 11/2000 | Park et al. ............... 257/310 | | JP | 63-062313 | 3/1988 |
| 6,147,334 A | 11/2000 | Hannigan .................. 219/544 | | JP | 63-085098 | 4/1988 |
| 6,151,447 A | 11/2000 | Moore et al. ............. 392/418 | | JP | 63-090833 | 4/1988 |
| 6,158,446 A | 12/2000 | Mohindra et al. ......... 134/25.4 | | JP | 63-222420 | 9/1988 |
| 6,174,377 B1 | 1/2001 | Doering et al. ............ 118/729 | | JP | 63-222421 | 9/1988 |
| 6,174,809 B1 | 1/2001 | Kang et al. ................ 438/682 | | JP | 63-227007 | 9/1988 |
| 6,183,563 B1 | 2/2001 | Choi et al. ................. 118/715 | | JP | 63-252420 | 10/1988 |
| 6,200,893 B1 | 3/2001 | Sneh ......................... 438/685 | | JP | 63-266814 | 11/1988 |
| 6,203,613 B1 | 3/2001 | Gates et al. ................ 117/104 | | JP | 64-009895 | 1/1989 |
| 6,206,967 B1 | 3/2001 | Mak et al. .................. 118/666 | | JP | 64-009896 | 1/1989 |
| 6,207,302 B1 | 3/2001 | Sugiura et al. ............. 428/690 | | JP | 64-009897 | 1/1989 |
| 6,231,672 B1 | 5/2001 | Choi et al. ................. 118/715 | | JP | 64-037832 | 2/1989 |
| 6,236,021 B1 | 5/2001 | Fair et al. ................... 219/388 | | JP | 64-082615 | 3/1989 |
| 6,248,605 B1 | 6/2001 | Harkonen et al. ........... 438/29 | | JP | 64-082617 | 3/1989 |
| 6,270,572 B1 | 8/2001 | Kim et al. .................... 117/93 | | JP | 64-082671 | 3/1989 |
| 6,271,148 B1 | 8/2001 | Kao et al. ................... 438/727 | | JP | 64-082676 | 3/1989 |
| 6,287,965 B1 | 9/2001 | Kang et al. ................. 438/648 | | JP | 01-103982 | 4/1989 |
| 6,291,876 B1 | 9/2001 | Stumborg et al. ........... 257/632 | | JP | 01-103996 | 4/1989 |
| 6,305,314 B1 | 10/2001 | Sneh et al. ............. 118/723 R | | JP | 64-090524 | 4/1989 |
| 6,306,216 B1 | 10/2001 | Kim et al. ................... 118/725 | | JP | 01-117017 | 5/1989 |
| 6,316,098 B1 | 11/2001 | Yitzchaik et al. ........... 428/339 | | JP | 01-143221 | 6/1989 |
| 6,423,949 B1 | 7/2002 | Chen et al. | | JP | 01-143233 | 6/1989 |
| 6,447,607 B1 | 9/2002 | Soininen et al. ............. 117/200 | | JP | 01-154511 | 6/1989 |
| 6,478,872 B1 | 11/2002 | Chae et al. ................... 117/88 | | JP | 01-236657 | 9/1989 |
| 6,481,945 B1 | 11/2002 | Hasper et al. ............... 414/217 | | JP | 01-245512 | 9/1989 |
| 6,511,539 B1 | 1/2003 | Raaijmakers ............... 117/102 | | JP | 01-264218 | 10/1989 |
| 6,551,406 B1 | 4/2003 | Kilpi ......................... 118/728 | | JP | 01-270593 | 10/1989 |
| 2001/0000866 A1 | 5/2001 | Sneh et al. ............. 118/723 R | | JP | 01-272108 | 10/1989 |
| 2001/0002668 A1 | 6/2001 | Gat ............................ 219/390 | | JP | 01-290221 | 11/1989 |
| 2001/0009140 A1 | 7/2001 | Bondestam et al. ........ 118/725 | | JP | 01-290222 | 11/1989 |
| 2001/0011526 A1 | 8/2001 | Doering et al. ............. 118/729 | | JP | 01-296673 | 11/1989 |
| 2001/0013312 A1 | 8/2001 | Soininen et al. .............. 117/86 | | JP | 01-303770 | 12/1989 |
| 2001/0014371 A1 | 8/2001 | Kilpi ..................... 427/255.28 | | JP | 01-305894 | 12/1989 |
| 2001/0031562 A1 | 10/2001 | Raaijmakers et al. ........ 438/770 | | JP | 01-313927 | 12/1989 |
| 2001/0034123 A1 | 10/2001 | Jeon et al. ................... 438/643 | | JP | 02-012814 | 1/1990 |
| 2001/0041250 A1 | 11/2001 | Werkhoven et al. ......... 428/212 | | JP | 02-014513 | 1/1990 |
| 2001/0042523 A1 | 11/2001 | Kesala ........................ 122/6.6 | | JP | 02-017634 | 1/1990 |
| 2001/0042799 A1 | 11/2001 | Inagawa et al. ............. 239/553 | | JP | 02-063115 | 3/1990 |
| 2001/0054377 A1 | 12/2001 | Lindfors et al. ............. 117/104 | | JP | 02-074029 | 3/1990 |
| 2002/0000196 A1 | 1/2002 | Park ........................... 118/715 | | JP | 02-074587 | 3/1990 |
| 2002/0007790 A1 | 1/2002 | Park ........................... 118/715 | | JP | 02-106822 | 4/1990 |
| 2002/0041931 A1 | 4/2002 | Suntola et al. .......... 427/255.28 | | JP | 02-129913 | 5/1990 |
| 2002/0052097 A1 | 5/2002 | Park ........................... 438/507 | | JP | 02-162717 | 6/1990 |
| 2002/0086106 A1 | 7/2002 | Park et al. ................. 427/248.1 | | JP | 02-172895 | 7/1990 |
| 2002/0086260 A1 | 7/2002 | Shang et al. ................. 423/247 | | JP | 02-196092 | 8/1990 |
| 2002/0092471 A1 | 7/2002 | Kang et al. ................. 118/715 | | JP | 02-203517 | 8/1990 |
| 2002/0094689 A1 | 7/2002 | Park ........................... 438/507 | | JP | 02-230690 | 9/1990 |
| 2002/0108570 A1 | 8/2002 | Lindfors ...................... 118/715 | | JP | 02-230722 | 9/1990 |
| 2002/0134307 A1 | 9/2002 | Choi .......................... 118/715 | | JP | 02-246161 | 10/1990 |
| 2003/0004723 A1 | 1/2003 | Chihara ...................... 704/260 | | JP | 02-264491 | 10/1990 |
| 2003/0075273 A1 | 4/2003 | Kilpela et al. .......... 156/345.33 | | JP | 02-283084 | 11/1990 |
| 2003/0075925 A1 | 4/2003 | Lindfors et al. ............ 285/367 | | JP | 02-304916 | 12/1990 |

OTHER PUBLICATIONS

| | | |
|---|---|---|
| EP | 0 799 641 A2 | 10/1997 |
| EP | 1167569 | 1/2002 |
| FR | 2 626 110 | 7/1989 |
| FR | 2 692 597 | 12/1993 |
| GB | 2 298 314 A | 8/1996 |
| GB | 2 355 727 A | 5/2001 |
| JP | 58-098917 | 6/1983 |
| JP | 58-100419 | 6/1983 |
| JP | 60-065712 A | 4/1985 |
| JP | 61-035847 | 2/1986 |
| JP | 03-019211 | 1/1991 |
| JP | 03-022569 | 1/1991 |
| JP | 03-023294 | 1/1991 |
| JP | 03-023299 | 1/1991 |
| JP | 03-044967 | 2/1991 |
| JP | 03-048421 | 3/1991 |
| JP | 03-070124 | 3/1991 |
| JP | 03-185716 | 8/1991 |
| JP | 03-208885 | 9/1991 |
| JP | 03-234025 | 10/1991 |
| JP | 03-286522 | 12/1991 |
| JP | 03-286531 | 12/1991 |

| | | |
|---|---|---|
| JP | 04-031391 | 2/1992 |
| JP | 04-031396 | 2/1992 |
| JP | 04-100292 | 4/1992 |
| JP | 04-111418 | 4/1992 |
| JP | 04-132214 | 5/1992 |
| JP | 04-132681 | 5/1992 |
| JP | 04/151822 | 5/1992 |
| JP | 04-162418 | 6/1992 |
| JP | 04-175299 | 6/1992 |
| JP | 04-186824 | 7/1992 |
| JP | 04-212411 | 8/1992 |
| JP | 04-260696 | 9/1992 |
| JP | 04-273120 | 9/1992 |
| JP | 04-29196 | 10/1992 |
| JP | 04-285167 | 10/1992 |
| JP | 04-291916 | 10/1992 |
| JP | 04-325500 | 11/1992 |
| JP | 04-328874 | 11/1992 |
| JP | 05-029228 | 2/1993 |
| JP | 05-047665 | 2/1993 |
| JP | 05-047666 | 2/1993 |
| JP | 05-047668 | 2/1993 |
| JP | 05-074717 | 3/1993 |
| JP | 05-074724 | 3/1993 |
| JP | 05-102189 | 4/1993 |
| JP | 05-160152 | 6/1993 |
| JP | 05-175143 | 7/1993 |
| JP | 05-175145 | 7/1993 |
| JP | 05-182906 | 7/1993 |
| JP | 05-186295 | 7/1993 |
| JP | 05-206036 | 8/1993 |
| JP | 05-234899 | 9/1993 |
| JP | 05-235047 | 9/1993 |
| JP | 05-251339 | 9/1993 |
| JP | 04-291916 | 10/1993 |
| JP | 05-270997 | 10/1993 |
| JP | 05-283336 | 10/1993 |
| JP | 05-291152 | 11/1993 |
| JP | 05-304334 | 11/1993 |
| JP | 05-343327 | 12/1993 |
| JP | 05-343685 | 12/1993 |
| JP | 06-045606 | 2/1994 |
| JP | 06-132236 | 5/1994 |
| JP | 06-177381 | 6/1994 |
| JP | 06-196809 | 7/1994 |
| JP | 06-222388 | 8/1994 |
| JP | 06-224138 | 8/1994 |
| JP | 06-230421 | 8/1994 |
| JP | 06-252057 | 9/1994 |
| JP | 06-291048 | 10/1994 |
| JP | 07-070752 | 3/1995 |
| JP | 07-086269 | 3/1995 |
| JP | 08-181076 | 7/1996 |
| JP | 08-245291 | 9/1996 |
| JP | 08-264530 | 10/1996 |
| JP | 09-260786 | 10/1997 |
| JP | 09-293681 | 11/1997 |
| JP | 10-188840 | 7/1998 |
| JP | 10-190128 | 7/1998 |
| JP | 10-308283 | 11/1998 |
| JP | 11-269652 | 10/1999 |
| JP | 2000-031387 | 1/2000 |
| JP | 2000-058777 | 2/2000 |
| JP | 2000-068072 | 3/2000 |
| JP | 2000-087029 | 3/2000 |
| JP | 2000-319772 | 3/2000 |
| JP | 2000-138094 | 5/2000 |
| JP | 2000-218445 | 8/2000 |
| JP | 2000-319772 | 11/2000 |
| JP | 2000-340883 | 12/2000 |
| JP | 2000-353666 | 12/2000 |
| JP | 2001-020075 | 1/2001 |
| JP | 2001-62244 | 3/2001 |
| JP | 2001-152339 | 6/2001 |
| JP | 2001-172767 | 6/2001 |
| JP | 2001-189312 | 7/2001 |
| JP | 2001-217206 | 8/2001 |
| JP | 2001-220287 | 8/2001 |
| JP | 2001-220294 | 8/2001 |
| JP | 2001-240972 | 9/2001 |
| JP | 2001-254181 | 9/2001 |
| JP | 2001-284042 | 10/2001 |
| JP | 2001-303251 | 10/2001 |
| JP | 2001-328900 | 11/2001 |
| WO | 90/02216 | 3/1990 |
| WO | 91/10510 A1 | 7/1991 |
| WO | 93/02111 A1 | 2/1993 |
| WO | 96/17107 A1 | 6/1996 |
| WO | 96/18756 A1 | 6/1996 |
| WO | 98/06889 | 2/1998 |
| WO | 98/51838 | 11/1998 |
| WO | 99/01595 | 1/1999 |
| WO | 99/13504 | 3/1999 |
| WO | 99/29924 A1 | 6/1999 |
| WO | 99/41423 A2 | 8/1999 |
| WO | 99/65064 | 12/1999 |
| WO | 00/11721 | 3/2000 |
| WO | 00/15865 A1 | 3/2000 |
| WO | 00/15881 A2 | 3/2000 |
| WO | 00/16377 A2 | 3/2000 |
| WO | 00/54320 A1 | 9/2000 |
| WO | 00/63957 A1 | 10/2000 |
| WO | 00/79019 A1 | 12/2000 |
| WO | 00/79576 | 12/2000 |
| WO | 00/79576 A1 | 12/2000 |
| WO | 01/15220 A1 | 3/2001 |
| WO | 01/17692 | 3/2001 |
| WO | 01/27346 A1 | 4/2001 |
| WO | 01/27347 A1 | 4/2001 |
| WO | 01/29280 A1 | 4/2001 |
| WO | 01/29891 A1 | 4/2001 |
| WO | 01/29893 A1 | 4/2001 |
| WO | 01/36702 A1 | 5/2001 |
| WO | 01/36702 | 5/2001 |
| WO | 01/40541 A1 | 6/2001 |
| WO | 01/66832 A2 | 9/2001 |
| WO | 02/08488 | 1/2002 |
| WO | 02/056349 A | 7/2002 |
| WO | 03/034473 A2 | 4/2003 |

OTHER PUBLICATIONS

Klaus, et al., "Atomic Layer Deposition of SiO$_2$ Using Catalyzed and Uncatalyzed Self–Limiting Surface Reactions", *Surface Review & Letters*, 6(3&4) (1999), pp. 435–448.

Yamaguchi, et al., "Atomic–layer chemical–vapor–deposition of silicon dioxide films with extremely low hydrogen content", *Appl. Surf. Sci.*, vol. 130–132 (1998), pp. 202–207.

George, et al., "Surface Chemistry for Atomic Layer Growth", *J. Phys. Chem.*, vol. 100 (1996), pp. 13121–13131.

George, et al., "Atomic layer controlled deposition of SiO$_2$ and Al$_2$O$_3$ using ABAB . . . binary reaction sequence chemistry", *Appl. Surf. Sci.*, vol. 82/83 (1994), pp. 460–467.

Wise, et al., "Diethyldiethoxysilane as a new precursor for SiO$_2$ growth on silicon", *Mat. Res. Soc. Symp. Proc.*, vol. 334 (1994), pp. 37–43.

Niinisto, et al., "Synthesis of oxide thin films and overlayers by atomic layer epitaxy for advanced applications", *Mat. Sci. & Eng.*, vol. B41 (1996), pp. 23–29.

Ritala, et al., "Perfectly conformal TiN and $Al_2O_3$ films deposited by atomic layer deposition", *Chemical Vapor Deposition*, vol. 5(1) (Jan. 1999), pp. 7–9.

Klaus, et al., "Atomically controlled growth of tungsten and tungsten nitride using sequential surface reactions". *Appl. Surf. Sci.*, vol. 162–163 (2000), pp. 479–491.

Min, et al., "Atomic layer deposition of TiN thin films by sequential introduction of Ti precursor and NH/sub3/", *Symp.: Advanced Interconnects and Contact Materials and Processes for Future Integrated Circuits* (Apr. 13–16, 1998), pp. 337–342.

Klaus, et al., "Atomic Layer Deposition of Tungsten using Sequential Surface Chemistry with a Sacrificial Stripping Reaction, " Thin Solid Films 360 (2000), pp. 145–153, (Accepted Nov. 16, 1999).

Min, et al., "Metal–Organic Atomic–Layer Deposition of Titanium–Silicon–Nitride Films", *Applied Physics Letters*, American Inst. Of Physics, vol. 75(11) (Sep. 13, 1999).

Martensson, et al., "Atomic Layer Epitaxy of Copper on Tantalum", *Chemical Vapor Deposition*, 3(1) (Feb. 1, 1997), pp. 45–50.

Ritala, et al. "Atomic Layer Epitaxy Growth of TiN Thin Films", *J. Electrochem. Soc.*, 142(8) (Aug. 1995), pp. 2731–2737.

Elers, et al., "NbC15 as a precursor in atomic layer epitaxy", *Appl. Surf. Sci.*, vol. 82/83 (1994), pp. 468–474.

Lee, "The Preparation of Titanium–Based Thin Film by CVD Using Titanium Chlorides as Precursors", *Chemical Vapor Deposition*, 5(2) (Mar. 1999), pp. 69–73.

Min, et al., "Chemical Vapor Deposition of Ti–Si–N Films with Alternating Source Supply", *Mat. Res. Soc. Symp. Proc.*, vol. 564 (Apr. 5, 1999), pp. 207–210.

Bedair, "Atomic layer epitaxy deposition processes", *J. Vac. Sci. Technol.* 12(1) (Jan./Feb. 1994).

Yamaga, et al., "Atomic layer epitaxy of ZnS by a new gas supplying system in a low–pressure metalorganic vapor phase epitaxy", *J. of Crystal Growth* 117 (1992), pp. 152–155.

Elam, et al., "Nucleation and growth during tungsten atomic layer deposition on SiO2 surfaces," *Thin Solid Films 386* (2001) pp. 41–52, (Accepted Dec. 14, 2000).

Ohba, et al., "Thermal Decomposition of Methylhydrazine and Deposition Properties of CVD TiN Thin Films", Conference Proceedings, Advanced Metallization for ULSI Applications in 1993 (1994), pp. 143–149.

Scheper, et al., "Low–temperature deposition of titanium nitride films from dialkylhydrazine–based precursors", Materials Science in Semiconductor Processing 2 (1999), pp. 149–157.

Suzuki, et al., "A 0.2–$\mu$m contact filing by 450° C–hydrazine–reduced TiN film with low resistivity", IEDM 92–979, pp. 11.8.1–11.8.3.

Suzuki, et al., "LPCVD–TiN Using Hydrazine and $TiCl_4$", VMIC Conference (Jun. 8–9, 1993), pp. 418–423.

IBM Tech. Disc. Bull. Knowledge–Based Dynamic Scheduler in Distributed Computer Control, (Jun. 1990), pp. 80–84.

IBM Tech. Disc. Bull. "Multiprocessor and Multitasking Architecture for Tool Control of the Advanced via Inspection Tools" (May 1992), pp. 190–191.

McGeachin, S., "Synthesis and properties of some β–diketimines derived from acetylacetone, and their metal complexes", Canadian J. of Chemistry, vol. 46 (1968), pp. 1903–1912.

Solanki, et al., "Atomic Layer deposition of Copper Seed Layers", Electrochemical and Solid State Letters, 3(10) (2000), pp. 479–480.

NERAC.COM Retro Search: Atomic Layer Deposition of Copper, dated Oct. 11, 2001.

NERAC.COM Retro Search: Atomic Layer Deposition/ Epitaxy Aluminum Oxide Plasma, dated Oct. 2, 2001.

NERAC Search abstract of "Atomic Layer deposition of Ta and Ti for Interconnect Diffusion Barriers", by Rossnagel, et al., J. Vac. Sci. & Tech., 18(4) (Jul. 2000).

Abstracts of articles re atomic layer deposition.

Abstracts of search results re atomic layer deposition, search dated Jan. 24, 2002.

Abstracts of articles re atomic layer deposition and atomic layer nucleation.

Abstracts of articles re atomic layer deposition and semiconductors and copper.

NERAC Search—Atomic Layer Deposition, search dated Oct. 16, 2001.

Bader, et al., "Integrated Processing Equipment", Solid State Technology, Cowan Pub., vol. 33, No. 5 (May 1, 1990), pp. 149–154.

Choi, et al., "The effect of annealing on resistivity of low pressure chemical vapor depositied titanium diboride", J. Appl. Phys. 69(11) (Jun. 1, 1991), pp. 7853–7861.

Choi, et al., "Stability of $TiB_2$ as a Diffusion Barrier on Silicon", J. Electrochem. Soc. 138(10). (Oct. 1991), pp. 3062–3067.

"Cluster Tools for Fabrication of Advanced devices" Jap. J. of Applied Physics, Extended Abstracts, $22^{nd}$ Conference Solid State Devices and Materials (1990), pp. 849–852.

"Applications of Integrated processing", Solid State Technology, US, Cowan Pub., vol. 37, No. 12 (Dec. 1, 1994), pp. 45–47.

Kitigawa, et al., "Hydrogen–mediated low temperature epitaxy of Si in plasma–enhanced chemical vapor deposition", Applied Surface Science (2000), pp. 30–34.

Lee, et al., "Pulsed nucleation for ultra–high aspect ratio tungsten plugfill", Novellus Systems, Inc. (2001), pp. 1–2 (Copy Not Available to Applicant at this Time).

Martensson, et al., "Atomic Layer Epitaxy of Copper, Growth & Selectivity in the Cu (II)–2,2.6,6–Tetramethyl–3, 5–Heptanedion ATE/H2 Process", J. Electrochem. Soc., 145(8) (Aug. 1998), pp. 2926–2931.

International Search Report for PCT/US01/50262, dated Jul. 2, 2002.

International Preliminary Examination Report for PCT/ US01/50262, dated Oct. 23, 2003.

Copy of International Search Report dated Mar. 31, 2004 for Corresponding PCT Application, PCT/US03/30810.

* cited by examiner

CHAMBER FOR UNIFORM SUBSTRATE HEATING

CROSS-REFERENCE TO RELATED APPLICATIONS

The present patent application is a continuation-in-part of U.S. patent application Ser. No. 10/025,152, filed Dec. 18, 2001 now U.S. Pat. No. 6,765,178, which claims priority from U.S. Provisional Patent Application Ser. No. 60/259,035, filed Dec. 29, 2000. The present patent application also claims priority from U.S. Provisional Patent Application Ser. No. 60/434,064, filed Dec. 17, 2002. All of the above patent applications are hereby incorporated by reference herein in their entirety.

BACKGROUND OF THE INVENTION

1. Field of the Invention

Aspects of the invention generally relate to apparatus and methods for heating substrates.

2. Background of the Related Art

In the fabrication of flat panel displays (FPD), thin film transistors (TFT), liquid crystal cells, metal interconnects and other features are formed by depositing and removing multiple layers of conducting, semiconducting and/or dielectric materials from a glass substrate. The various features formed are integrated into a system that collectively is used to create, for example, an active matrix display screen in which display states are electrically generated in individual pixels on an FPD. Processing techniques used to create an FPD include plasma-enhanced chemical vapor deposition (PECVD), physical vapor deposition (PVD), etching, and the like. Plasma processing is particularly well suited for the production of flat panel displays because of the relatively low processing temperatures employed during film deposition and because of the good film quality which results from plasma processes.

During FPD processing, uniform and controlled heat processing of films formed on a substrate is often critical for the FPD to function properly. The heating temperature required varies depending on the type of film being processed, and process being performed. For example, one exemplary type of film used in the construction of FPDs is low temperature poly silicon (LTPS). Part of the LTPS film processing requires the LTPS film be heated up to about 600° C. to remove hydrogen from the film, whereas a similar heat treatment for an amorphous silicon ($\alpha$-Si) film requires a substantially lower temperature of up to about 450° C.

Generally, a film heating process is highly temperature sensitive as temperature non-uniformity may cause insufficient removal of unwanted contaminates, resulting in peeling and ablation of the film. To compensate for temperature non-uniformity, heating process time may be extended. Unfortunately, extending heating process time increases production cost, and may result in unusable films if the process is not completed (e.g., if heating process time is insufficiently extended).

Conventional heating chambers provide heat processing by heating one or more substrates through a combination of gas conduction and heat radiation. Unfortunately, chamber walls and other internal chamber components provide heat conduction paths within a chamber, resulting in conductive heat losses. The conductive heat losses create a constantly fluctuating substrate-heating environment. As the temperatures are increased, conductive heat losses become more pronounced, exacerbating the heat non-uniformity within the substrate-heating environment. Moreover, conventional heating chambers are often very large (to accommodate the substrate perimeter), further exacerbating the heating non-uniformity issues by increasing the area and volume to be heated. For example, to meet the demand for larger computer displays, monitors, flat-screen televisions, and the like, larger substrates must be employed. A typical FPD substrate may be 730 mm×920 mm or larger.

To compensate for larger substrates, larger chamber volumes, and the subsequent increase in heat losses, more heating elements may be used, thereby increasing the cost of the equipment, energy usage, and temperature non-uniformity. As temperatures increase, copper heating elements are often employed to offset energy costs and provide efficient heating. Copper heaters are generally more energy efficient than other types of heating elements. Unfortunately, as the temperatures are increased, copper atoms from the copper heaters often escape into the heating chamber and contaminate the film. Thus, traditional heating chambers and heating processes do not provide acceptably uniform and contaminant-free substrate heating for an efficient and cost effective substrate heating process.

Therefore, there is a need for methods and apparatus for uniformly heat processing a plurality of substrates.

SUMMARY OF THE INVENTION

In a first aspect of the invention, a first apparatus is provided for heating substrates. The first apparatus includes (1) a chamber having a bottom portion and a top portion; (2) a plurality of heated supports disposed within the chamber to support at least two substrates thereon; and (3) a heater disposed within the chamber between a sidewall of the chamber and the plurality of substrate supports and having an edge region and a center region. The heater is adapted to produce more heat within the edge region than within the center region of the heater.

In a second aspect of the invention, a second apparatus is provided for heating substrates. The second apparatus includes (1) a chamber having an upper section and a lower section; (2) a cassette having a plurality of heated supports adapted to store a plurality of substrates within the chamber; and (3) a plurality of heaters adapted to apply more heat near corner, sidewall regions of the upper and lower sections of the chamber than near center, sidewall regions of the upper and lower sections of the chamber.

In a third aspect of the invention, a third apparatus is provided for heating substrates. The third apparatus includes a chamber having an upper section and a lower section coupled to the upper section. The upper section and lower section define a cavity adapted to hold a plurality of substrates therein. The third apparatus also includes (1) a cassette having a plurality of heated supports disposed within the cavity and adapted to support and heat the plurality of substrates; (2) one or more heaters positioned within the cavity so as to provide heat to the cassette by applying more heat to corner, sidewall regions of the chamber than to center, sidewall regions of the chamber; and (3) a heat reflector disposed within the cavity and surrounding at least a portion of the heated supports to form a reflective surface directed into the cavity. Numerous other aspects are provided, including systems and methods in accordance with these and other aspects of the invention.

Other features and aspects of the present invention will become more fully apparent from the following detailed description, the appended claims and the accompanying drawings.

DETAILED DESCRIPTION

Embodiments of the invention have particular advantages in a multi-chamber processing system such as a cluster tool, commonly used in the semiconductor industry and well suited for supporting the substrate-heating chamber described herein. A cluster tool is a modular system comprising multiple chambers that may perform various functions including substrate heating, center-finding and orientation, annealing, deposition and/or etching. The multiple chambers typically are mounted to a central transfer chamber which houses a robot adapted to transfer substrates between the chambers. The transfer chamber may be maintained in a vacuum condition and provide an intermediate stage for transferring substrates from one chamber to another and/or to a load lock chamber positioned, for example, at a front end of the cluster tool.

Figure 1:
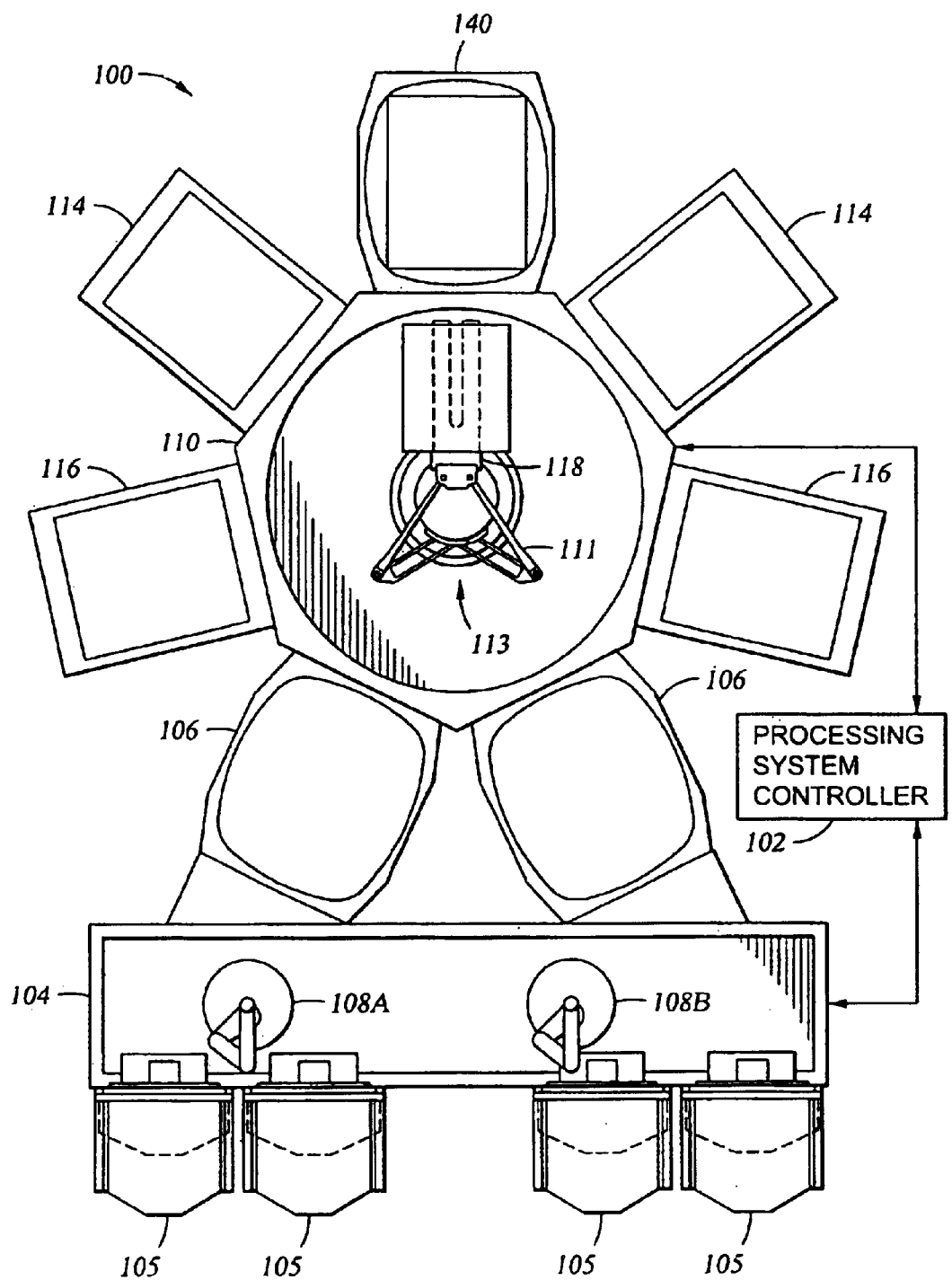
FIG. 1 is a top plan view of a typical processing system for semiconductor device fabrication wherein the present invention may be used to advantage.

FIG. 1 is a top plan view of a typical processing system 100 for semiconductor device fabrication wherein the present invention may be used to advantage. The present invention also may be employed with other processing systems.

The processing system 100 generally comprises a plurality of chambers and robots and may be equipped with a process system controller 102 programmed to carry out the various processing methods performed in the processing system 100. A front-end environment 104, such as a factory interface, is shown positioned in selective communication with a pair of load lock chambers 106. Specifically, the front-end environment 104 allows substrates contained within substrate carriers or pods 105 to be transferred to the load lock chambers 106. Other interface configurations may be employed. Pod loader robots 108A–B disposed in the front-end environment 104 may be capable of linear, rotational, and/or vertical movement to transfer substrates between the load lock chambers 106 and a plurality of pods 105 (which may be mounted on and/or interfaced with the front-end environment 104).

The load lock chambers 106 provide a first vacuum interface between the front-end environment 104 and a transfer chamber 110. Two load lock chambers 106 are provided to increase throughput by alternatively communicating with the transfer chamber 110 and the front-end environment 104. Thus, while one load lock chamber 106 communicates with the transfer chamber 110, a second load lock chamber 106 may communicate with the front-end environment 104.

A robot 113 is centrally disposed in the transfer chamber 110 to transfer substrates from the load lock chambers 106 to one or more processing chambers 114 or holding chambers 116. The processing chambers 114 are adapted to perform any number of processes such as film deposition, annealing, etching, or the like while the holding chambers 116 are adapted to perform substrate orientation, cool down or the like. The processing system 100 includes a heating chamber 140 that may be used to heat substrates during a heat process, such as during hydrogen removal and/or annealing. The heating chamber 140 typically is located within the processing system 100 in the most efficient processing position, but in general may be located anywhere within processing system 100. For example, a heating process step may follow a deposition process step. Therefore, to reduce the movement of the robot 113, the heating chamber 140 may be located adjacent one of the processing chambers 114 used for a deposition process step.

Figure 2:
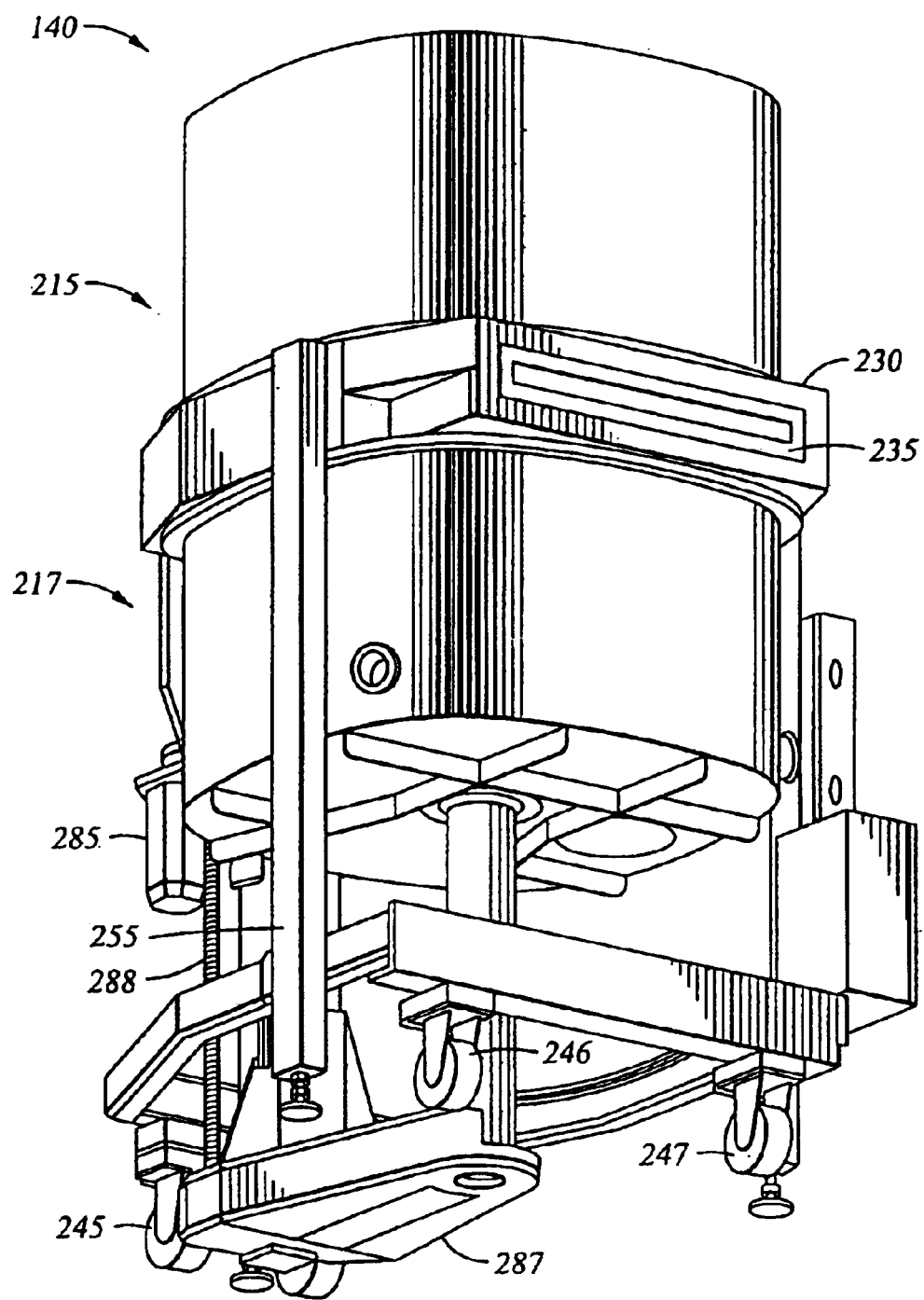
FIG. 2 is a perspective view of an exemplary embodiment of a heating chamber of FIG. 1.

FIG. 2 is a perspective view of an exemplary embodiment of the heating chamber 140 of FIG. 1. With reference to FIG. 2, the heating chamber 140 comprises an upper section 215 (e.g., an upper bell jar) and a lower section 217 (e.g., a lower bell jar) wherein the upper section 215 is separated from the lower section 217 by a connecting body 230 having a loading window 235. The upper and lower sections 215, 217 are sealably attached to and generally symmetrical and coaxial with the connecting body 230. The upper section 215 and lower section 217 may be sealed to the connecting body 230 using, for example, frictional fit, sealing materials such as gaskets or putty adapted to withstand high temperatures, adhesives such as pressure sensitive adhesives, ceramic bonding, glue, and the like that are process resistant and free of contaminates such as copper. The upper section 215 and lower section 217 may be connected to connecting body 230 by conventional means such as welding, or by using bolts, clamps or other fasteners as are known in the art.

The heating chamber 140 is mounted on a mounting frame 255 to provide support for the upper section 215 and lower section 217. In one aspect, the mounting frame 255 may comprise rotatably mounted casters 245, 246, and 247 on a lower end of the mounting frame 255 for moving the heating chamber 140. The mounting frame 255 may be attached to the heating chamber 140 (and connecting body 230) by conventional means such as bolts, clamps or other fasteners as are known in the art. While the heating chamber 140 is shown mounted on the mounting frame 255, it will be understood that the heating chamber 140 alternatively or additionally may be mounted to and/or supported by the transfer chamber 110 of FIG. 1 (e.g., using fasteners such as screws, bolts, clips, and the like).

A motor 285 may be coupled to the heating chamber 140 and used to transport substrates within the heating chamber 140 (e.g., by lifting and lowering a platform 287 that supports the substrates as described below). For example, the motor 285 may be coupled to and adapted to rotate a lead screw 288. The lead screw 288 is rotatably coupled to the platform 287, which is slidably coupled to the mounting frame 255. When the lead screw 288 is rotated by the motor 285, the platform 287 is vertically raised or lowered relative to the mounting frame 255.

In one embodiment, a thermally insulating layer (not shown) may be used to enclose, or wrap, the heating chamber 140 to minimize heat loss from the heating chamber 140. The thermally insulating layer may comprise an insulator such as fiberglass, ceramic fiber, asbestos, or other materials adapted to provide insulation from heat loss. In one embodiment, the insulating layer comprises a flexible insulating ceramic fiber blanket having a thermal conductivity of less than about 0.035 watt/m° K that stabilizes at a surface temperature of about 30° C.

Figure 3:
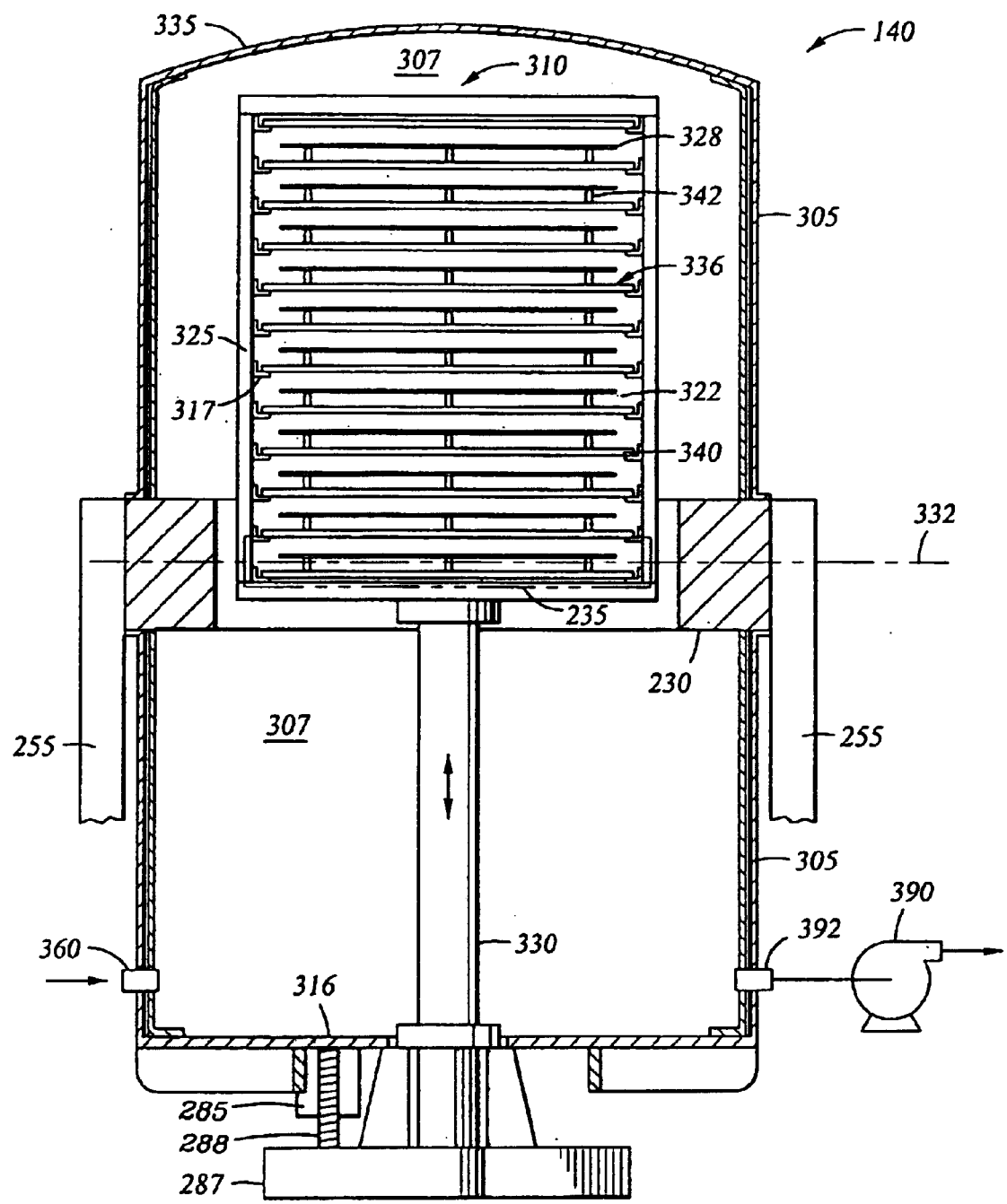
FIG. 3 is a cross-sectional view of one embodiment of the heating chamber of FIG. 2 adapted for substrate heat processing.

FIG. 3 is a cross-sectional view of one embodiment of the heating chamber 140 of FIG. 2 adapted for substrate heat processing. The heating chamber 140 of FIG. 3 comprises a body 305, a lid 335 and a bottom 316 that define a cavity 307 for heating a plurality of substrates 328 therein. In one aspect, the body 305 is formed of process resistant materials such as aluminum, steel, nickel, or the like, adapted to withstand process temperatures and is generally free of contaminates such as copper. The body 305 may comprise a gas inlet 360 extending into the cavity 307 for connecting the heating chamber 140 to a process gas supply (not shown) for delivery of processing gases therethrough. In another aspect, a vacuum pump 390 may be coupled to the cavity 307 through a vacuum port 392 for maintaining a vacuum within the cavity 307.

A substrate cassette 310 is moveably disposed within the cavity 307 and is coupled to an upper end of a movable member 330. The moveable member 330 comprises process resistant materials such as aluminum, steel, nickel, or the like, adapted to withstand process temperatures and generally free of contaminates such as copper. The movable member 330 enters the cavity 307 through the bottom 316 of the body 305. The movable member 330 is slidably and sealably disposed through the bottom 316 and is raised and lowered by the platform 287. That is, the platform 287 supports a lower end of the movable member 330 such that the movable member 330 is vertically raised or lowered with the raising or lowering of the platform 287. The movable member 330 vertically raises and lowers the cassette 310 within the cavity 307 to move the substrates 328 across a substrate transfer plane 332 extending through the window 235. The substrate transfer plane 332 is defined by the path along which substrates are moved into and out of the cassette 310 (through the window 235) by the robot 113.

The cassette 310 comprises a plurality of substrate-heating shelves 336 supported by a frame 325. Although FIG. 3 illustrates twelve substrate-heating shelves 336 within cassette 310, it will be understood that any number of shelves may be used. Each substrate-heating shelf 336 comprises a heated substrate support 340 (e.g., a heating plate) connected by brackets 317 to the frame 325. Other connection mechanisms may be employed. The brackets 317 connect the edges of the heated substrate support 340 to the frame 325 and may be attached to both the frame 325 and heated substrate support 340 using adhesives such as pressure sensitive adhesives, ceramic bonding, glue, etc., or fasteners such as screws, bolts, clips, etc., that are process resistant and are free of contaminates such as copper.

The frame 325 and brackets 317 may comprise materials such as ceramics, aluminum, steel, nickel, and the like that are process resistant and are generally free of contaminates such as copper. While the frame 325 and brackets 317 may be separate items, it will be understood that the brackets 317 may be integral with the frame 325 to form support members for the heated substrate supports 340. While, in one aspect, the heated substrate supports 340 are conformal to and/or slightly larger than the substrates 328 to maximize heating efficiency by applying a majority of generated heat to the substrates 328, in general the heated substrate supports 340 may be of any shape adapted to provide desired substrate heating. For example, in one embodiment the heated substrate supports 340 may be considerably larger than the substrates 328 to ensure that the substrates 328 are fully exposed to heat from the heated substrate supports 340. Alternatively, the heated substrate supports 340 may be formed to accommodate substrates 328 of various sizes.

The substrate-heating shelves 336 are spaced vertically apart and parallel within the cassette 310 to define a plurality of substrate-heating spaces 322. Each substrate-heating space 322 is adapted to heat at least one substrate 328 contained therein and supported on a plurality of support pins 342. The substrate-heating shelves 336 above and below each substrate 328 establish the upper and lower boundary of the substrate-heating space 322 such that the top and bottom sides of the substrate 328 are exposed to heat. In one embodiment, the upper and lower boundaries are equidistant from the substrate 328 in order to ensure uniform heating of both sides of the substrate 328. To ensure similar heating of the top substrate 328 in the cassette 310, the upper boundary for the top heating space 322 is established by an empty heated substrate support 340. In another embodiment, the spacing and substrate position may be adjusted to accommodate different heating requirements for different processes such as annealing, hydrogen removal, and the like.

The spacing between the upper and lower boundary of each heating space 322 may be adjusted to increase or decrease the rate of heating, and the amount of heat applied to each substrate side. For example, the spacing between the upper and lower boundary of a heating space 322 can be decreased to increase the radiant energy from the heated substrate supports 340 that define the heating space 320 to thereby increase the temperature and rate of substrate heating, or increased to reduce the incident radiant energy, thereby lowering the substrate temperature and slowing substrate heating. Moreover, a substrate 328 may be positioned closer to either the upper or the lower boundary of a heating space 322 to provide differing amounts of heating to either side of the substrate 328. In one aspect, to increase production efficiency, the spacing between the upper and lower boundary of each heating space 322 may be adjusted to heat a substrate 328 at a desired rate and temperature while allowing the cassette 310 to hold as many substrate-heating shelves 336 as possible. In one aspect, the spacing between the upper and lower boundary of each heating space 322 is about 45 mm. About 45 mm of spacing between the upper and lower boundary is believed to provide adequate space to receive a substrate 328, uniform substrate heating, and efficient space utilization within the chamber 307 to increase/maximize the number of substrate-heating shelves 336. Other spacings may be employed.

Figure 4:
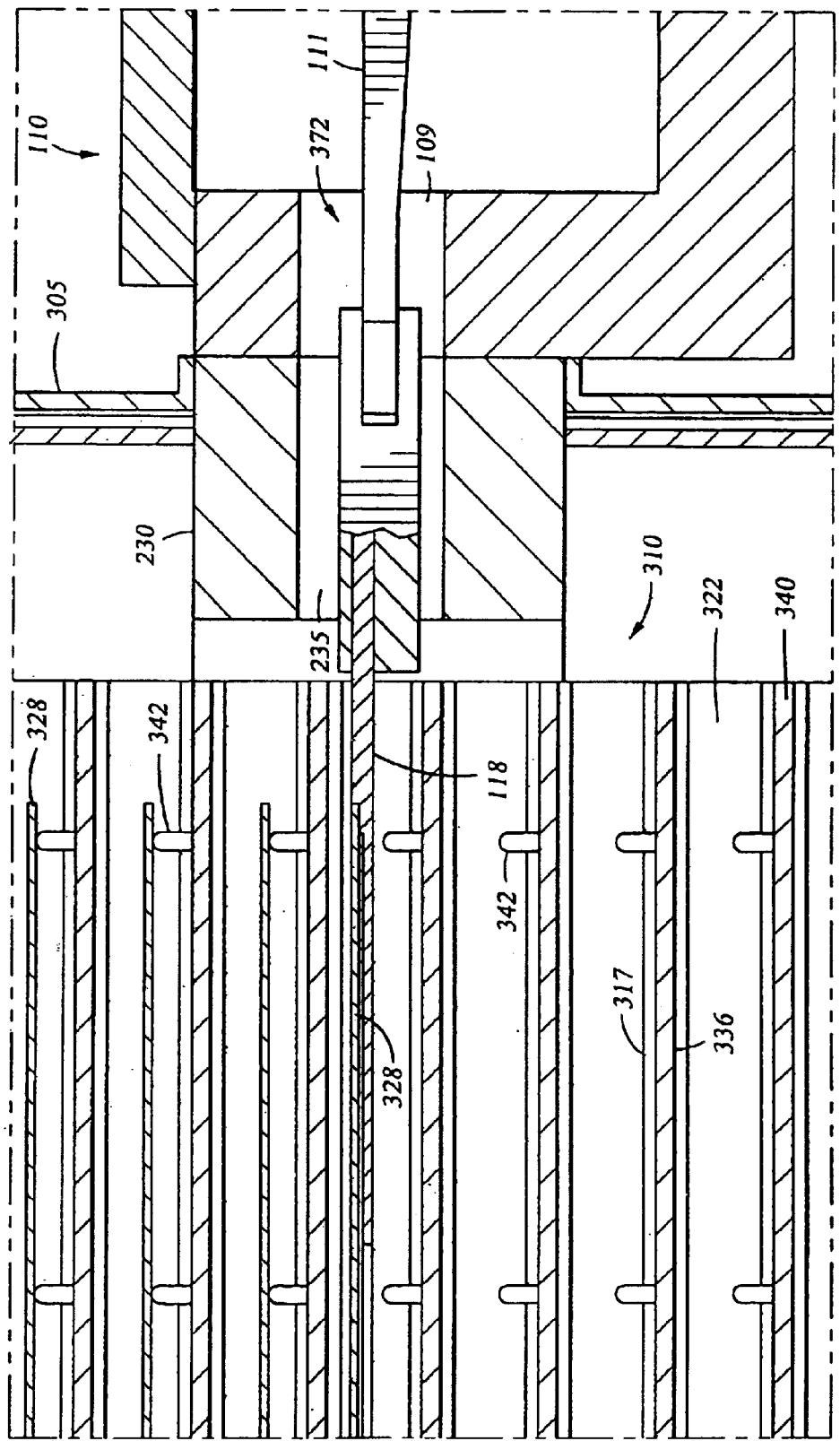
FIG. 4 illustrates a cross-sectional view of the heating chamber and a transfer chamber of FIGS. 1–3.

FIG. 4 illustrates a cross-sectional view of the heating chamber 140 and transfer chamber 110 of FIGS. 1–3. As shown in FIG. 4, the heating chamber 140 is positioned so that the window 235 is registered (e.g., aligned) with an opening 109 formed in the sidewall of transfer chamber 110. In such a position, the transfer chamber opening 109 and the window 235 define a substrate transfer aperture 372 through which substrates 328 may be transferred by robot 113 (FIG. 1). The substrate transfer aperture 372 is selectively sealed by a sealing apparatus such as a gate valve or slit valve (not shown).

To load a substrate 328 into the cassette 310, the robot 113 receives the substrate 328 on a blade 118 supported on arms 111 of the robot 113. For example, the substrate may be received from one of the load lock chambers 106, one of the holding chambers 116 or one of the processing chambers 114. The blade 118 then is positioned to deliver the substrate 328 to the heating chamber 140 through the substrate transfer aperture 372. The cassette 310 is moved vertically up or down to position an empty heating space 322 inline with the substrate transfer plane 332 to receive the substrate 328. The arms 111 then are extended through the substrate transfer aperture 372 to dispose the substrate 328 within the heating chamber 140 and subsequently dispose the substrate 328 within the empty heating space 322 of the cassette 310. The arms 111 extend the substrate 328 into the heating space 322 and position the substrate 328 above the pins 342. In one embodiment, the cassette 310 moves vertically until the pins 342 contact the substrate 328, lifting the substrate 328 off of the blade 118. The arms 111 and blade 118 then are retracted back to the transfer chamber 110. In another embodiment, the arms 111 and blade 118 move vertically downward until the substrate 328 contacts the pins 342. The arms 111 and blade 118 continue to move downward until the substrate 328 is fully supported by the pins 342. The reverse process may be performed to remove the substrate 328 from the cassette 310.

Figure 5:
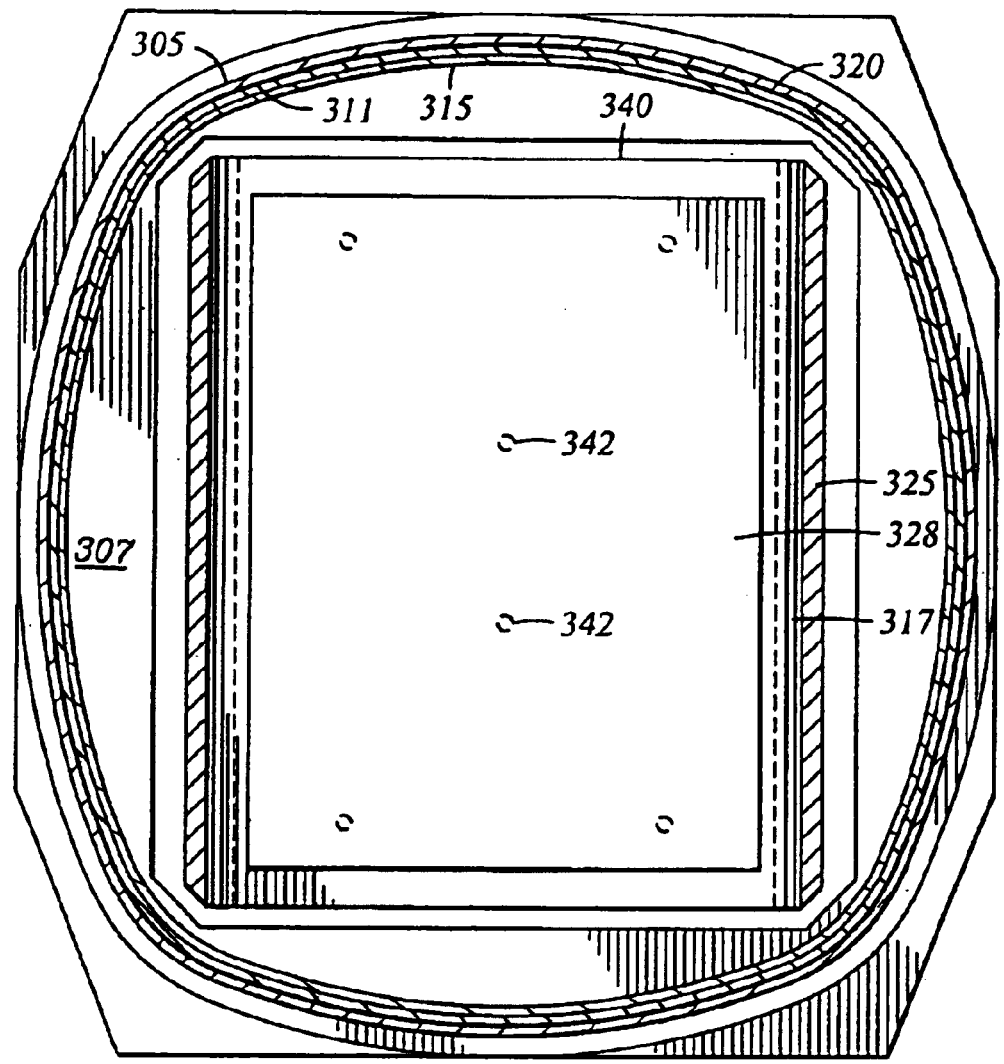
FIG. 5 is a cross-section top view of an exemplary embodiment of the heating chamber of FIGS. 1–4.

FIG. 5 is a cross-section top view of an exemplary embodiment of the heating chamber 140 of FIGS. 1–4. Because the cavity 307 of the heating chamber 140 holds a plurality of substrates 328, the cavity 307 is typically larger in volume than chambers such as processing chambers 114 and holding chambers 116, which usually hold only one substrate 328. Because of the increased volume of the cavity 307, external atmospheric pressures on the chamber 140 may be considerable when the chamber 140 is under vacuum. To provide structural strength and to reduce cavity volume, the cavity 307 is preferably semi-round in shape and is conformal with and slightly larger than the cassette 310. In other embodiments, the shape of the cavity 307 may be round, square, or any shape adapted to accommodate the substrates 328 and to have sufficient structural integrity to withstand external atmospheric pressures.

Figure 6:
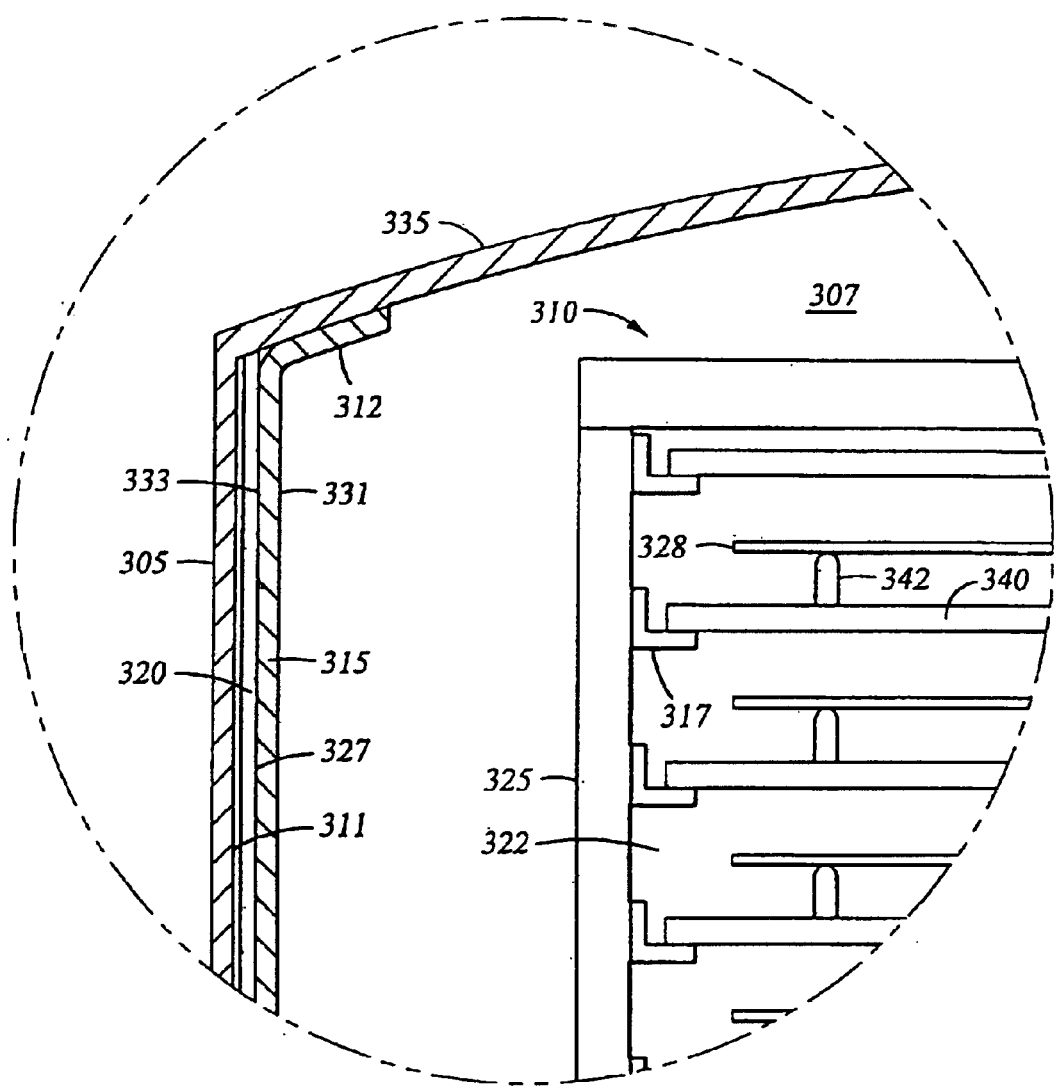
FIG. 6 is a partial cross-sectional view of the heating chamber of FIGS. 1–3.

FIG. 6 is a partial cross-sectional view of the heating chamber 140 of FIGS. 1–3. As shown in FIG. 6, a heat reflector 320 is disposed within the cavity 307 of the heating chamber 140 and positioned adjacent an inner surface 311 of body 305 of the heating chamber 140, forming a reflective surface within the cavity 307. The heat reflector 320 is adapted to minimize conductive heat losses through the body 305 by providing radiant heat insulation between the cavity 307 and the inner surface 311. The heat reflector 320 reflects radiated heat within the cavity 307 away from the inner surface 311 and toward the center of the cavity 307. The heat reflector 320 may comprise a single layer. Alternatively, the heat reflector 320 may comprise multiple layers, or several pieces combined to form a unified body. The heat reflector 320 may comprise, for example, one or more heat conductors such as aluminum, nickel, steel, or the like that are process resistant and generally free of contaminates such as copper. When additional insulation is desired between the cavity 307 and the inner surface 311, the heat reflector 320 may comprise one or more insulators such as metal plated ceramics, glass, or the like that are process resistant and generally free of contaminates such as copper. In at least one embodiment, the heat reflector 320 comprises an inner heat reflective surface 327 plated with aluminum, nickel, gold, or other materials adapted to reflect heat and that are process resistant and generally free of contaminates such as copper.

The heat reflector 320 may be attached to the inner surface 311 using several methods such as bonding to the inner surface 311, using pressure sensitive adhesives, ceramic bonding, glue, or the like, or by fasteners (e.g., screws, bolts, clips, etc., that are process resistant and generally free of contaminates such as copper). Additionally, the heat reflector 320 can be deposited on the inner surface 311 using techniques such as electroplating, sputtering, anodizing, etc. In one embodiment, the heat reflector 320 is spaced from the inner surface 311 using insulated fasteners such as insulated screws, bolts, clips, or the like, forming a gap between the inner surface 311 and the heat reflector 320.

A heater 315 is disposed within the cavity 307 between the heat reflector 320 and the cassette 310. The heater 315 is adapted to form a heating member conforming to and surrounding the cassette 310. The heater 315 may comprise, for example, one or more heating elements such as resistive heaters, heating lamps, or the like disposed within a layer, or layers, of heat conducting materials such as nickel, steel, aluminum, etc., that radiate heat. Although, in one or more embodiments, an inside surface 331 of the heater 315 is preferably bead blasted or anodized to provided a higher heat emissivity to improve the transmission of radiated heat within the cavity 307, other types of surface conditioning adapted to provided greater surface emissivity may be used. An outer surface 333 of the heater 315 may be polished to provide a low emissivity, thereby minimizing the transmission of radiated heat to the chamber body 305. During substrate heat processing, the heater 315 is activated by a power source (not shown) and heated to a desired temperature. Although, in one aspect, a gap is established between the heater 315 and the heat reflector 320 to minimize heat transfer via conduction to the heat reflector 320, in other aspects the heater 315 may be in direct contact with heat reflector 320.

Figure 7:
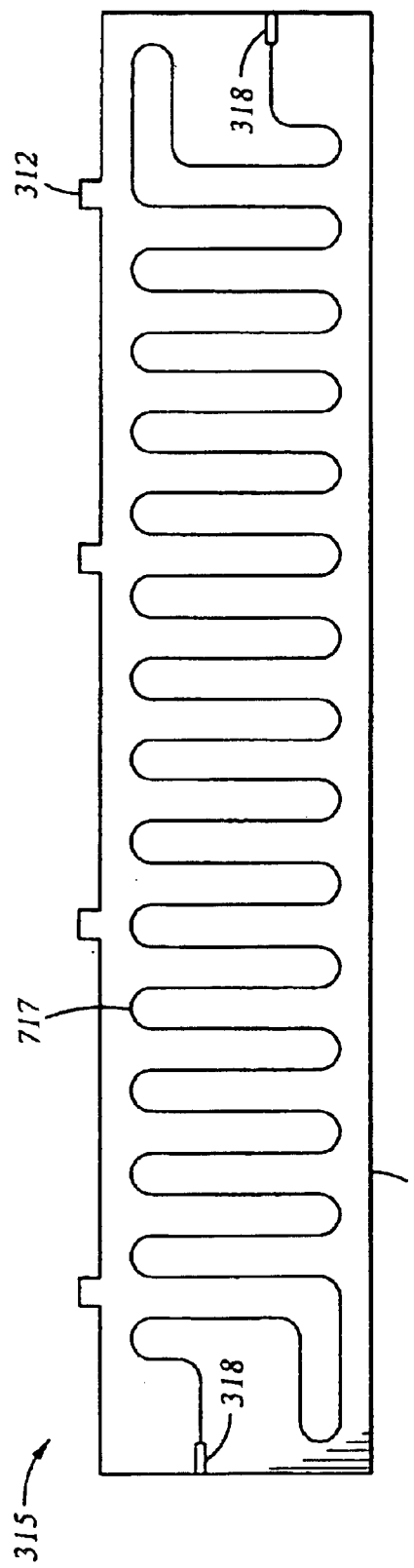
FIGS. 7 and 8 illustrate a first exemplary embodiment of a heater of FIG. 6.
Figure 8:
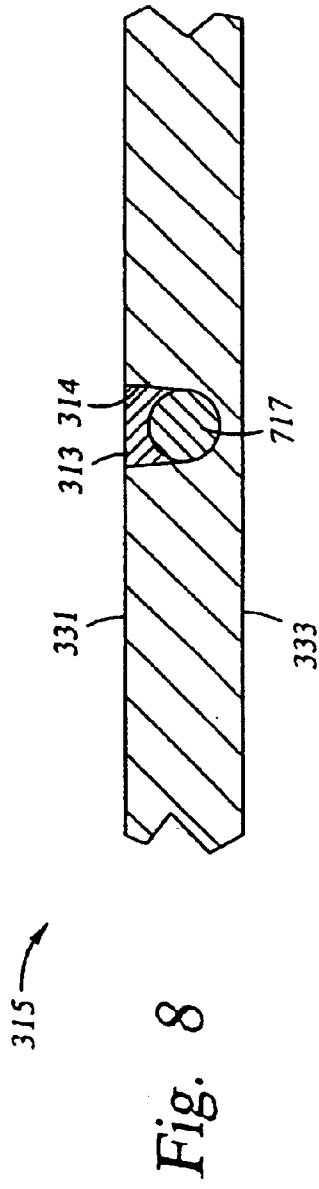

FIGS. 7 and 8 illustrate a first exemplary embodiment of the heater 315 of FIG. 6. With reference to FIGS. 7 and 8, the heater 315 comprises a jacket 319 comprising one or more thermally conducting materials such as aluminum, nickel, steel, or the like adapted to uniformly radiate heat within the cavity 307 and that are process resistant and generally free of contaminates such as copper. A continuous heating element 717 is disposed within a slot 314 formed within the jacket 319. The continuous heating element 717 is adapted to radiate heat within the jacket 319. The continuous heating element 717 may be secured within slot 314 by frictional fit, welding, fill material 313 generally free of contaminates such as copper and/or silver, adhesives such as pressure sensitive adhesives, ceramic bonding, glue, and/or fasteners such as screws, bolts, clips, or the like that are process resistant and generally free of contaminates such as copper. In one embodiment, to provide a tighter fit between the jacket 319 and the continuous heating element 717, the continuous heating element 717 has a higher coefficient of expansion than that of the jacket 319. Although, in one aspect, the thermal expansion coefficient for the continuous heating element 717 is about $\alpha=17$, and the thermal expansion coefficient for the jacket 319 is about $\alpha=13$, other thermal expansion coefficients may be used to advantage.

A pair of couplings 318 are connected to a power source (not shown), such as an external power supply, to provide power to the continuous heating element 717. Although it is preferred that the continuous heating element 717 be formed as a unified and homogenous heating member to provide uniform heating throughout the jacket 319, a plurality of individual heating elements such as resistive heaters, lamps and the like, may be coupled together to form the continuous heating element 717. Additionally, the jacket 319 may be heated by a plurality of the individual heaters dispersed and coupled discretely throughout jacket 319.

The heater 315 may be secured within the cavity 307 using any of several methods. For example, the heater 315 may be attached to the inner surface 311 using attachment methods such as bonding, adhesives such as pressure sensitive adhesives, ceramic bonding, glue, and/or fasteners such as screws, bolts, clips, or the like that are process resistant and generally free of contaminates such as copper. In a particular embodiment, the heater 315 comprises an upper portion having a mounting flange 312 for mounting the heater 315 to the body 305. Although it is preferred that the mounting flange 312 be integral to the heater 315, the mounting flange 312 may be a separate component. The mounting flange 312 may be attached to the body 305 using adhesives such as pressure sensitive adhesives, ceramic bonding, glue, and/or fasteners such as screws, bolts, clips, etc., that are process resistant and generally free of contaminates such as copper.

Figure 9:
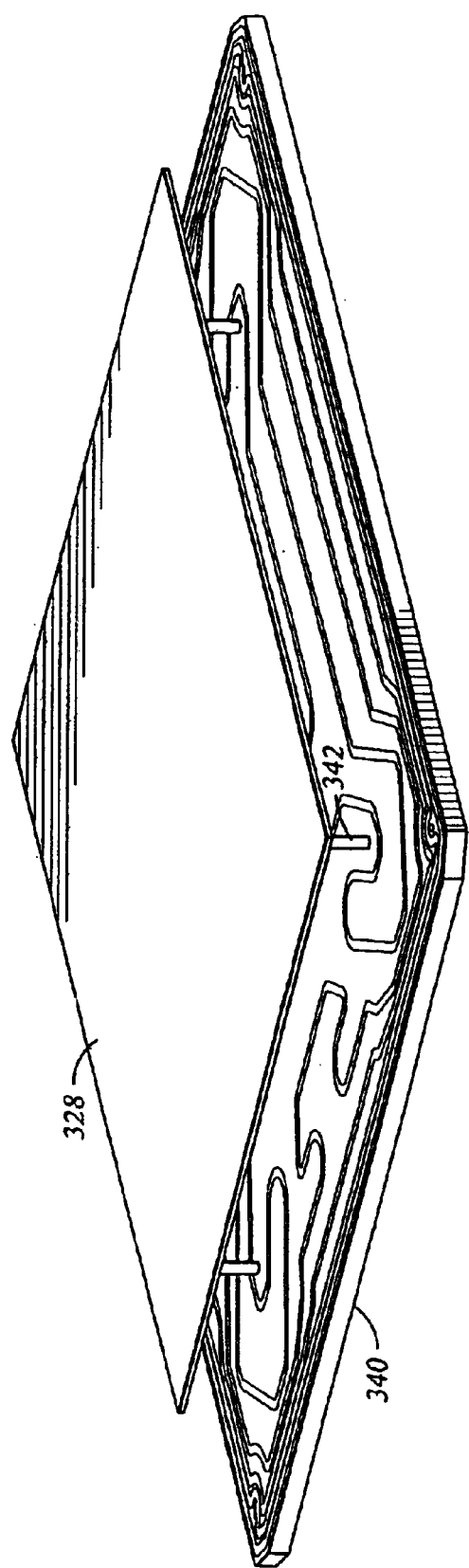
FIG. 9 illustrates an exemplary embodiment of a heated substrate support and support pins wherein a substrate is spaced from the heated substrate support and supported by the support pins so as to form a lower portion of a heating space.

FIG. 9 illustrates an exemplary embodiment of the heated substrate support 340 and the support pins 342 wherein a substrate 328 is spaced from the heated substrate support 340 and supported by the support pins 342 so as to form a lower portion of a heating space 322. In one aspect, the number of support pins 342 is at least six, with four support pins 342 spaced substantially uniformly along the outer periphery of the substrate 328 to fully support the edges of the substrate 328 and two support pins 342 adjacent the middle of the substrate 328, as illustrated in FIG. 5. Alternatively, any number of support pins 342 may be used in any configuration adapted to support the substrate 328. The supporting pins 342 preferably comprise insulators such as polymers, ceramics, or the like with a cross section adapted to minimize contact with the substrate 328 and to prevent/reduce conduction between the heated substrate support 340 and the substrate 328. For additional supporting strength the supporting pins 342 may also comprise conductors such as steel, aluminum, nickel, etc., having a sufficiently small surface area to minimize conduction, that are process resistant, and generally free from contaminates such as copper. While in one aspect the support pins 342 comprise a pointed tip to minimize contact with substrate 328, in general the support pins 342 may have any tip cross section and profile adapted to support the substrate 328 such as a rounded tip, square tip, flat tip, or the like adapted to minimize heat conduction to the heated substrate support 340.

Figure 10:
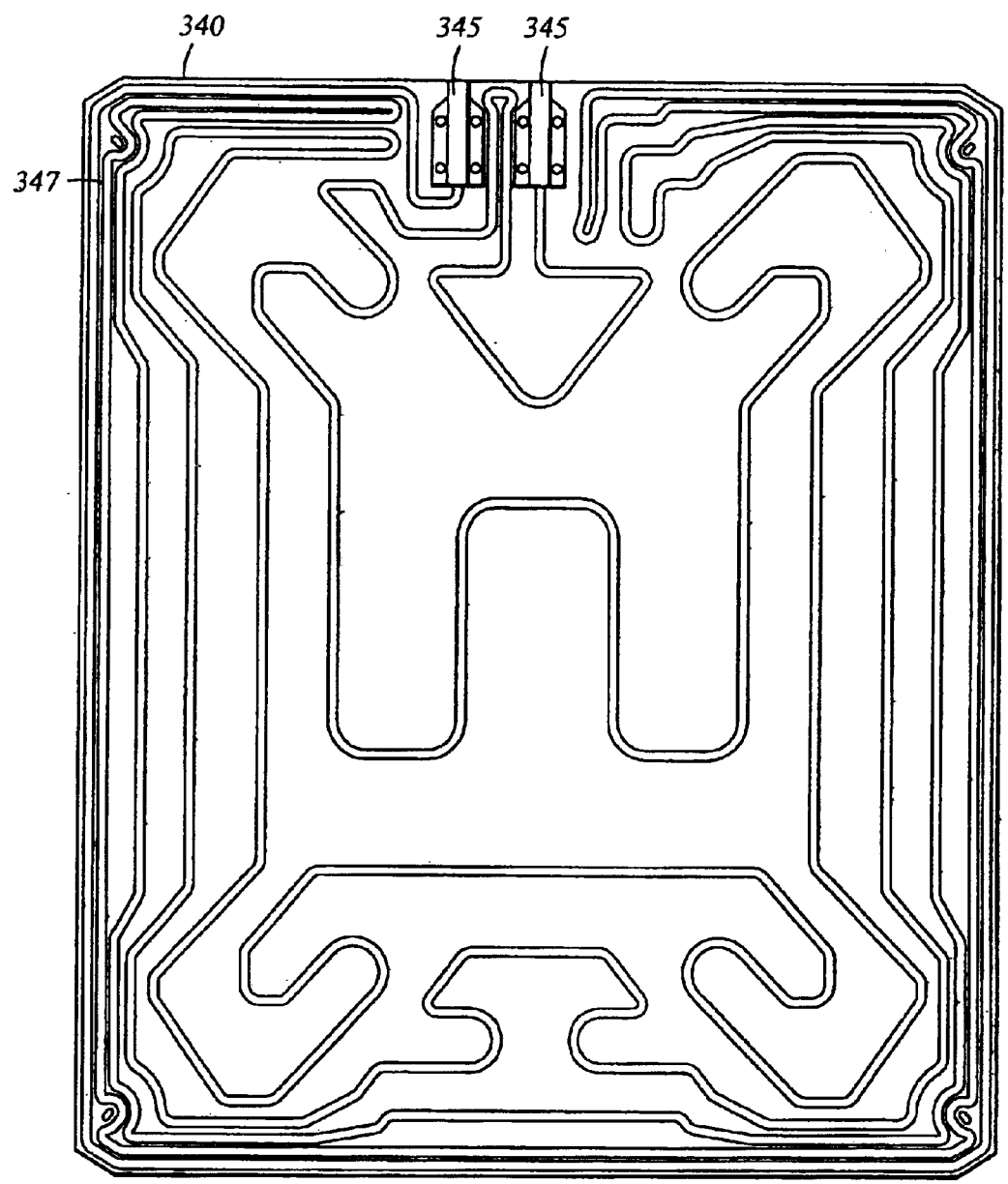
FIG. 10 is a top view of an exemplary embodiment of the heated substrate support of FIG. 9 wherein the heated substrate support comprises a plurality of plate heaters disposed within a layer of thermally and electrically insulating material such as fiberglass, glass, ceramic, asbestos, or a similar material.

FIG. 10 is a top view of an exemplary embodiment of the heated substrate support 340 of FIG. 9 wherein the heated substrate support 340 comprises a plurality of plate heaters 347 disposed within a layer of thermally and electrically insulating material such as fiberglass, glass, ceramic, asbestos, or a similar material. The plate heaters 347 may be resistive heaters, radiant lamps, etc. The plate heaters 347 may be activated by power supplied by a power source (not shown) such as an external power supply coupled to the heaters 347 through connectors 345. Typically, the temperature across substrate surfaces varies as a function of substrate body heat migration due to convection and conduction within the heating chamber 140, proximity of the substrate to the heated substrate support 340, characteristics of the support pins 342 and/or the heater 315, and the overall thermal profile within the cavity 307. In one embodiment, the plate heaters 347 are patterned to provide a radiant heating profile that matches and compensates for substrate thermal losses, i.e., the substrate heat loss profile. For example, the plate heaters 347 illustrated in FIG. 10 are spaced closer together near the corners of the heated substrate support 340 compared to the middle of the heated substrate support 340 to provide more concentrated heat to the corners and edges of a substrate 328 where a substantial amount of conductive and/or radiated heat loss may occur. Although, heat typically radiates from substrate edges, the patterned heating profile may be adapted to encompass any variation in substrate heat loss profile. For example, the plate heaters 347 may be adapted to provide a variable amount of heat output by varying their size, spacing, resistivity, illumination, input power, or the like to more closely match substrate heat loss profile. Moreover, the heated substrate support 340 is spaced from a substrate 328 by the support pins 342 as shown in FIGS. 3, 4, and 6 to allow the radiated heat between the lower surface of the substrate 328 and upper surface of the heated support 340 to intermix (e.g., distribute more uniformly). Although, in one aspect the spacing between the heated substrate support 340 and the substrate 328 is about 20 mm, other spacings may be employed. Although it is believed that the radiant heat from the heated substrate support 340 intermixes before heating the substrate 328, thereby minimizing hotspots defined by the plate heater configuration, it will be understood that the substrate 328 may be laid directly on a heated substrate support 340 with plate heaters 347 adapted to substantially match substrate heat loss profile.

In operation, a heating chamber 140 heating process is initiated by the robot 113 placing a substrate 328 (via window 235) within the cavity 307 of the heating chamber 140 on (or above) a heated substrate support 340. An inert process gas, such as nitrogen, is flowed into the cavity 307 through the gas inlet 360 and is maintained at a required chamber pressure by the vacuum pump 390. Alternatively, the process gas may be an active process gas, such as fluorine, adapted for a particular process. The cavity 307 is heated with radiant heat by the heater 315 and the heated substrate supports 340, or by the heater 315 alone, in cooperation with the heat reflector 320, to a desired ambient level sufficient to provide a uniform substrate heating profile. In one or more embodiments the individual substrates 328 may be uniformly heated to a substrate body temperature of between about 350° C. to about 600° C. The temperature variation referenced to a temperature on the substrate body (i.e., normalized temperature variation) is about between +/−5° C. and about +/−10° C. Other temperature ranges may be employed.

Figure 11:
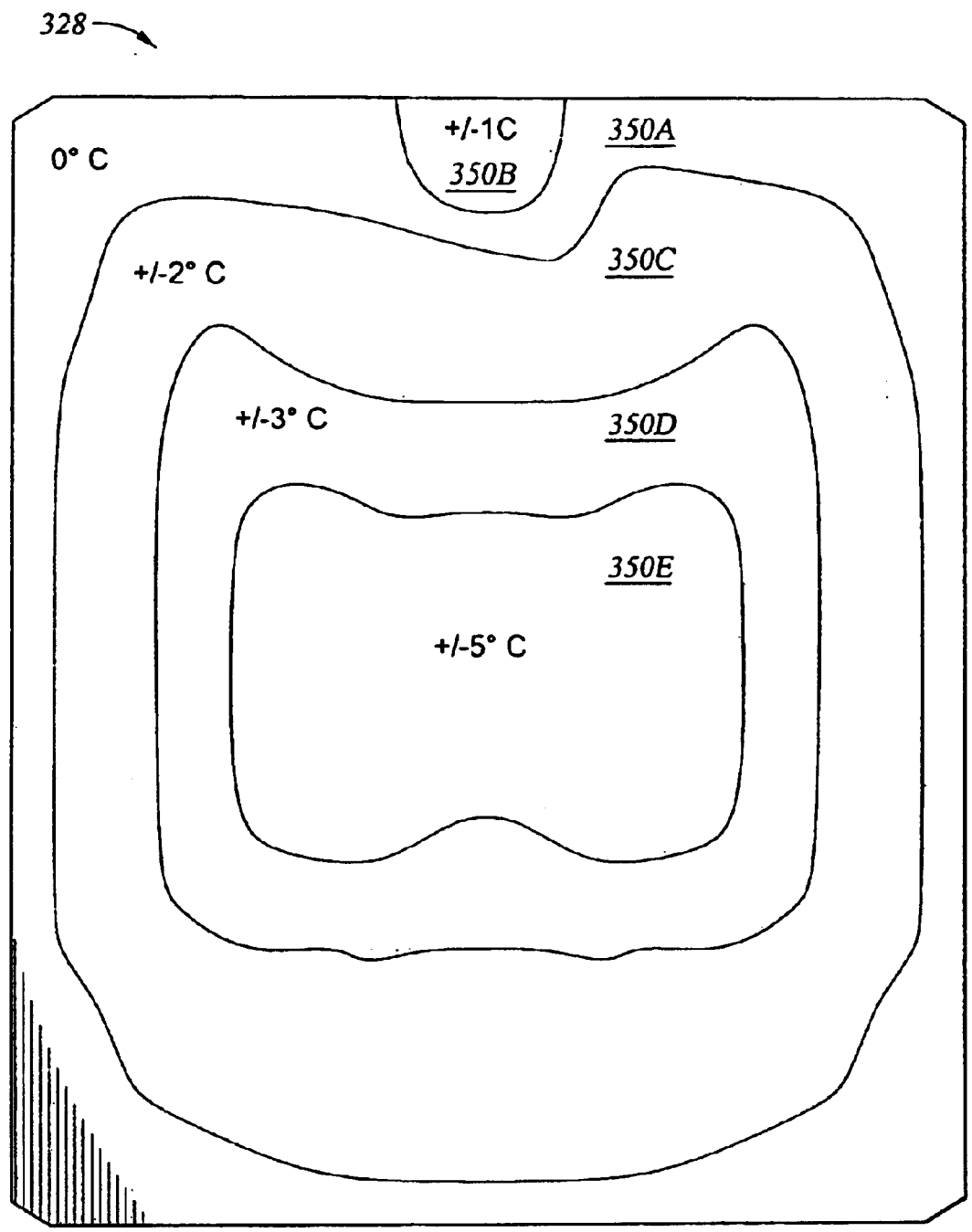
FIG. 11 is a temperature contour map of a substrate illustrating the normalized temperature variation across the body of the substrate, using perimeter temperature as the normalizing value, during heat processing at about 500° C.

For example, in one method of operation, a heating chamber 140 heating process is initiated by the robot 113 placing a substrate 328 (via window 235) within the cavity 307 on a heated substrate support 340. A vacuum within the cavity 307 is provided by vacuum pump 390 at about 0 to about 0.5 Torr. A process gas such as nitrogen is flowed into the cavity 307 through the gas inlet 360 and is maintained at chamber pressure at about 0.0 Torr to about 0.5 Torr by the vacuum pump 390. Heat is applied to each substrate 328 via heater 315 and heated supports 340 to heat each substrate uniformly to a temperature of about 450° C. to about 600° C. each. Each substrate maintains a normalized heating profile of about +/−5° C. at a substrate body temperature of about 450° C. to about +/−10° C. at a substrate body temperature of about 600° C. For example, FIG. 11 is a temperature contour map of a substrate 328 illustrating the normalized temperature variation across the body of the substrate 328, using perimeter temperature as the normalizing value, during heat processing at about 500° C. Region, 350A, is the reference region and therefore has a zero temperature variance. Region, 350B, has about a +/−1° C. normalized temperature variation. Region 350C has about a +/−2° C. normalized temperature variation. Region 350D has about a +/−3° C. normalized temperature variation. Region 350E has about a +/−5° C. normalized temperature variation. Thus, the normalized temperature variation across the substrate 328 is about +/−5° C.

Figure 12:
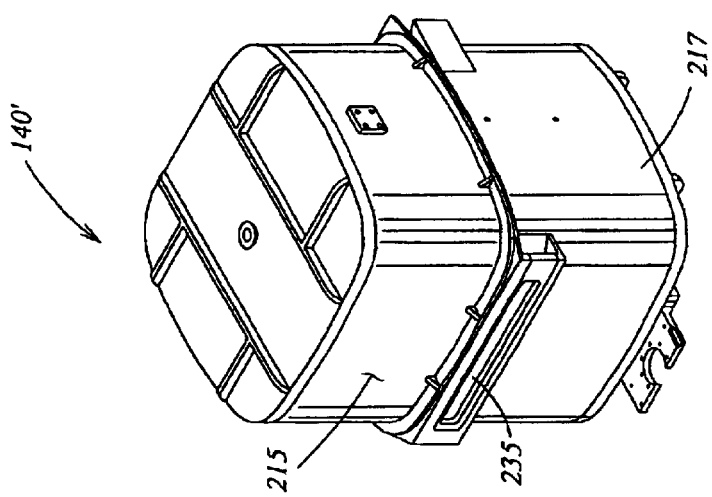
FIG. 12 is a perspective view of an alternative embodiment of the heating chamber of FIGS. 1–11.

FIG. 12 is perspective view of an alternative embodiment of the heating chamber 140 of FIGS. 1–11, referred to as heating chamber 140' in FIG. 12. With reference to FIG. 12, the heating chamber 140' includes an upper section 215 (e.g., an upper bell jar) and a lower section 217 (e.g., a lower bell jar). However, in the heating chamber 140' of FIG. 12, the loading window 235 comprises part of (e.g., is integrally formed with or is otherwise attached to) the lower section 217 as shown. In this manner, the upper section 215 and the lower section 217 are in direct contact. Alternatively, the loading window 235 may comprise part of the upper section 215. A connecting body 230 also may be employed to connect the upper section 215 to the lower section 217, and the window 235 may or may not form part of the connecting body 230.

Figure 14:
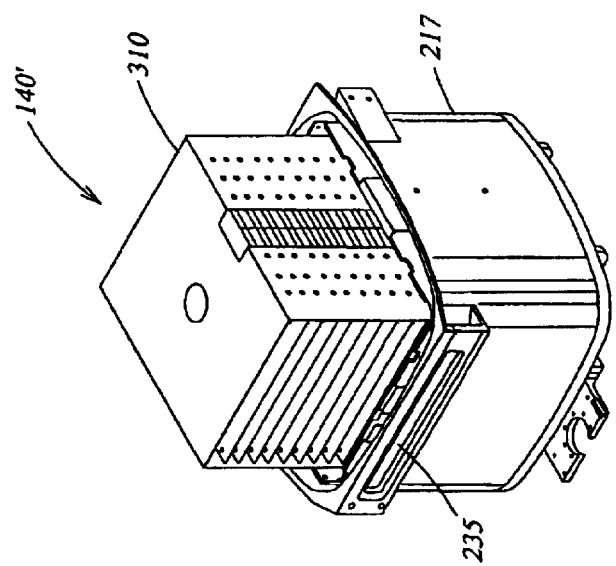
FIG. 14 is a perspective view of the heating chamber of FIG. 12 with the upper section and secondary heaters removed so as to expose the substrate cassette.
Figure 13:
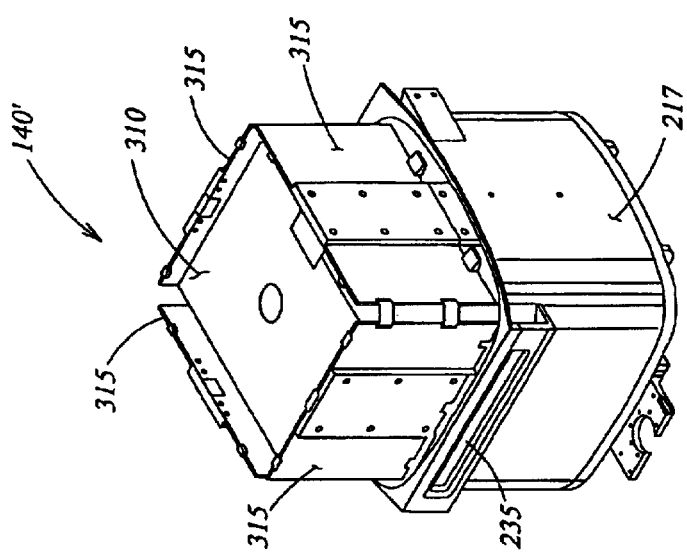
FIG. 13 is a perspective view of the heating chamber of FIG. 12 with an upper section removed so as to expose secondary heaters that surround a substrate cassette.
Figure 15:
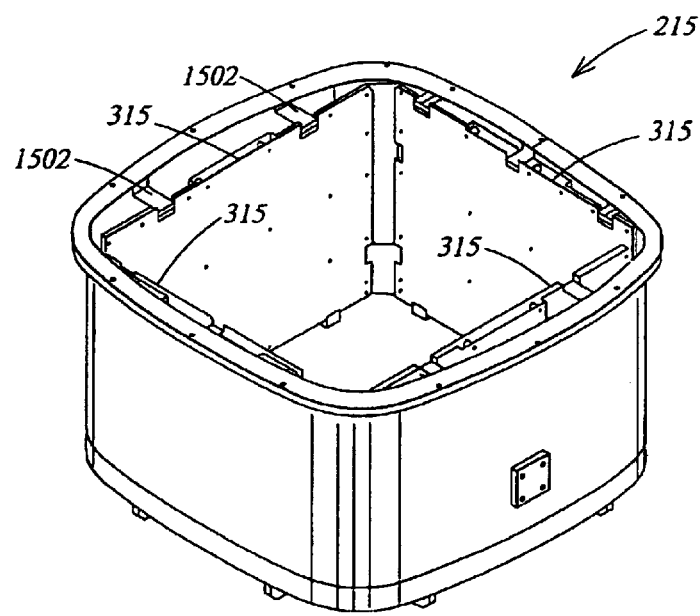
FIG. 15 is a perspective view of the upper section of the heating chamber that shows the secondary heaters coupled to sidewalls of the upper section.
Figure 16:
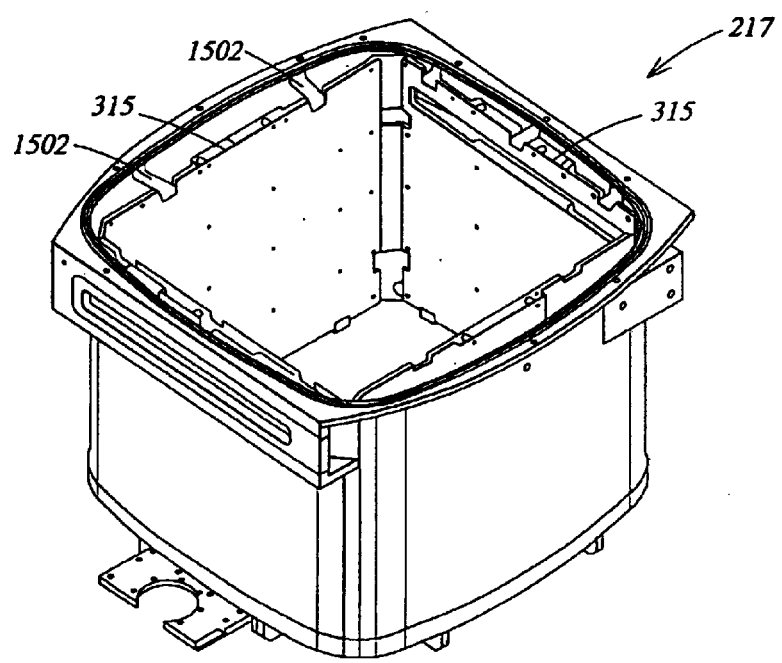
FIG. 16 is a perspective view of a lower section of the heating chamber that shows the secondary heaters coupled to sidewalls of the lower section.

FIG. 13 is a perspective view of the heating chamber 140' of FIG. 12 with the upper section 215 removed so as to expose the secondary heaters 315 that surround the substrate cassette 310. Similar secondary heaters 315 may surround the substrate cassette 310 within the lower section 217. FIG. 14 is a perspective view of the heating chamber 140' of FIG. 12 with the upper section 215 and secondary heaters 315 removed so as to expose the substrate cassette 310. FIG. 15 is a perspective view of the upper section 215 of the heating chamber 140' that shows the secondary heaters 315 coupled to sidewalls of the upper section 215 (e.g., via clips or other fasteners 1502); and FIG. 16 is a perspective view of the lower section 217 of the heating chamber 140' that shows the secondary heaters 315 coupled to sidewalls of the lower section 217 (e.g., via the clips or other fasteners 1502). The heating chamber 140' may operate similarly to the heating chamber 140 of FIGS. 1–11.

As stated previously, the ability to control the uniformity of large substrates (e.g., 730 mm×920 mm or greater) is essential during flat panel display fabrication. Non-uniform heating may result in film thickness and/or quality variations, insufficient and/or non-uniform removal of contaminates or annealing during heat treatment, or the like. One cause of substrate non-uniformity may be heat loss at substrate edges, which may cause a substrate to have a lower temperature at edges of the substrate compared to a central region of the substrate. The problem of temperature non-uniformity becomes greater as substrate size increases, and represents a large challenge to the flat panel display industry (e.g., as substrate size continues to increase).

The present inventors have found that significantly improved substrate heating uniformity may be achieved within the heating chamber 140, 140' if more heat is applied near the corner/sidewall regions of the upper and lower sections 215, 217 of the heating chamber 140, 140' than near the center/sidewall regions of the upper and lower sections 215, 217.

Figure 17:
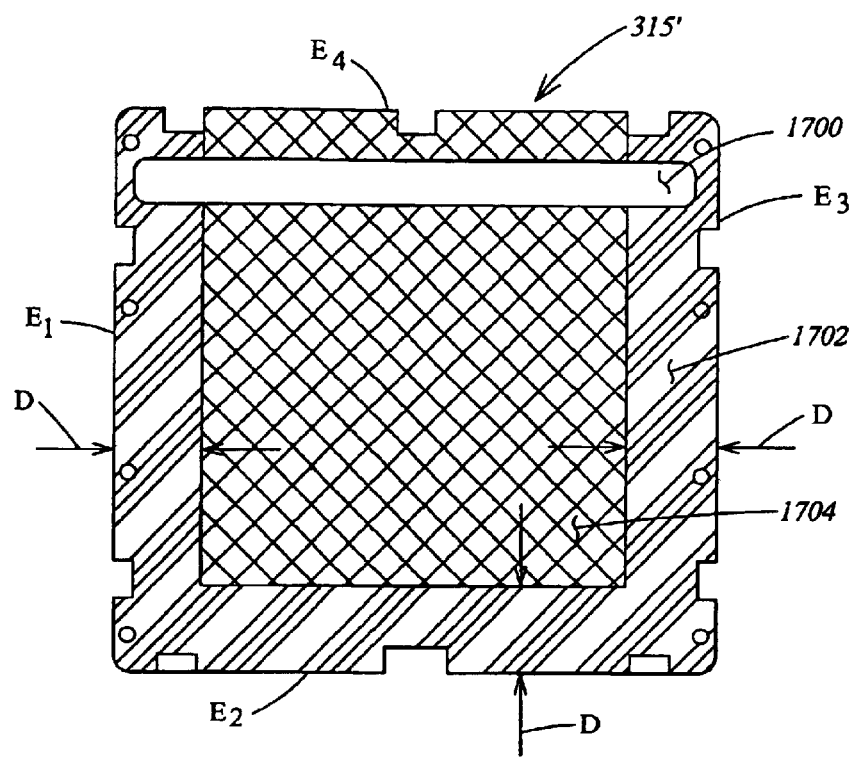
FIG. 17 is a front view of an alternative embodiment of the secondary heater of FIGS. 6–8, 13, 15 and/or 16 provided in accordance with the invention.

FIG. 17 is a front view of an alternative embodiment of the secondary heater 315 of FIGS. 6–8, 13, 15 and/or 16, referred to as secondary heater 315' in FIG. 17, provided in accordance with the invention. In the embodiment of FIG. 17, the secondary heater 315' includes an opening 1700 adapted to align with the window 235 of FIGS. 2–4 and/or 12–14 so as to allow a substrate to be loaded into and out of the substrate cassette 310. It will be understood that the other secondary heaters 315' employed within the heating chamber 140, 140' may be similarly configured, but need not include an opening 1700. In one particular embodiment, eight secondary heaters 315' may be employed (e.g., one near each sidewall of the upper section 215 and one near each sidewall of the lower section 217 of the heating chamber 140, 140'). In general, more or fewer than one secondary heater per section sidewall may be employed.

Figure 18:
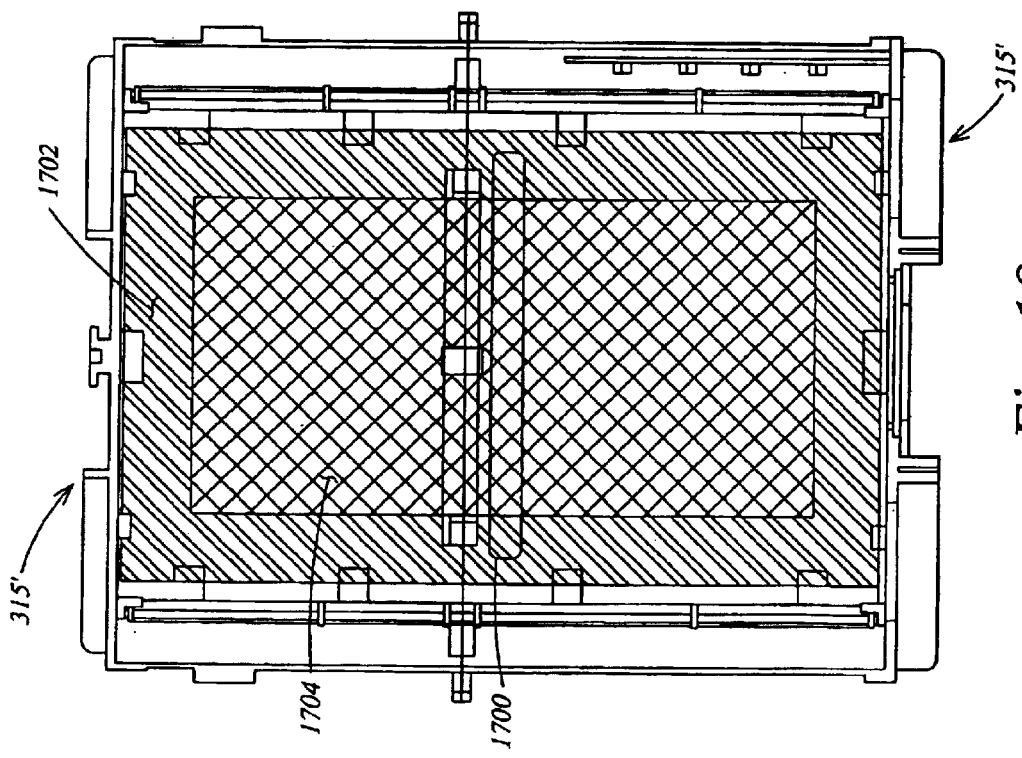
FIG. 18 illustrates two secondary heaters as they may be coupled together within the upper and lower sections of the heating chamber.

With reference to FIG. 17, the secondary heater 315' includes a first heater region 1702 and a second heater region 1704. The first heater region 1702 extends into the secondary heater 315' a distance D from each edge $E_{1-3}$ of the secondary heater 315' as shown. The remainder of the secondary heater 315' forms the second heater region 1704. As shown, a top edge $E_4$ of the secondary heater 315' is included in the second heater region 1704. In this manner, the secondary heater 315' of FIG. 17 may be positioned within the lower section 217 of the heating chamber 140, 140' (e.g., adjacent the sidewall of the lower section 217 and/or the connecting body 230 having the window 235 formed therein), and an additional secondary heater 315' may be positioned thereabove within the upper section 215 of the heating chamber 140, 140' so that both the upper and lower sections 215, 217 of the heating chamber 140, 140' are heated. FIG. 18 illustrates two secondary heaters 315' as they may be coupled together within the upper and lower sections 215, 217 of the heating chamber 140, 140'. Any suitable mechanism may be employed to couple the secondary heaters 315' together. An exemplary position for the opening 1700 is shown in FIG. 18.

With reference to FIGS. 17 and 18, the first heater region 1702 of the secondary heater 315' is configured to provide more heat (e.g., a larger Watt density) during heating than the second heater region 1704. As stated above, and as described further below, such "non-uniform" or "controlled" heating may compensate for heat loss at the edges of a substrate. Increased heating within the first heater region 1702 may be achieved, for example, by delivering additional power to the first heater region 1702 relative to the second heater region 1704. In one embodiment described below with reference to FIG. 19, this is achieved by increasing the density of resistive heater elements within the first heater region 1702 relative to the second heater region 1704. Alternatively, or additionally, when resistive heater elements are employed, separate power supplies may be used to deliver electrical power to resistive heater elements in the first heater region 1702 and in the second heater region 1704. In this manner, more electrical power may be delivered to the first heater region 1702 to increase heat generation therein. In another embodiment, one or more additional heat sources (e.g., lamp heaters) may be employed to increase heat generation of the first heater region 1702. Such additional heat sources may or may not be part of the secondary heater 315'. Any other configuration for adjusting heating of the first heater region 1702 relative to the second heater region 1704 or for otherwise increasing heating near the sidewall corners of the upper and lower sections 215, 217 may be employed.

Figure 19:
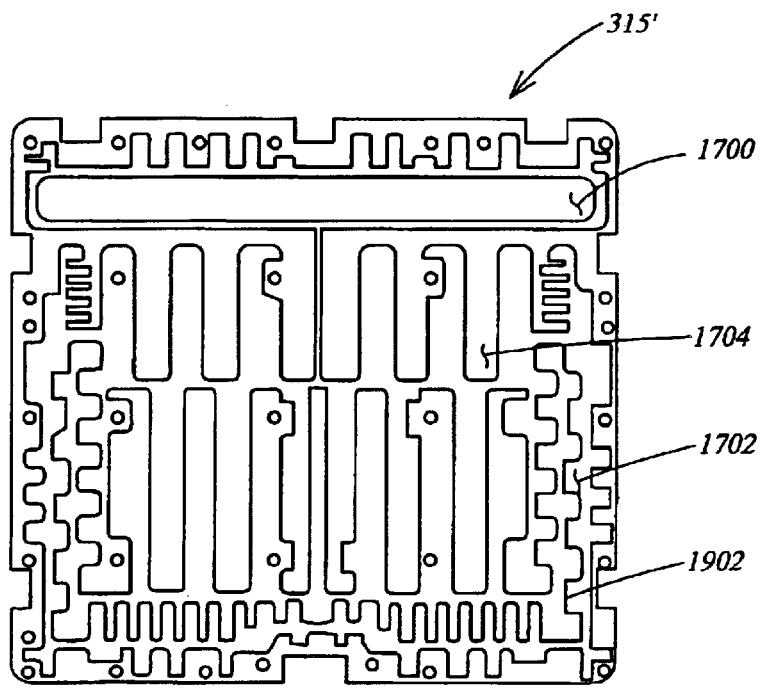
FIG. 19 illustrates an exemplary embodiment of the secondary heater of FIG. 17.
Figure 20:
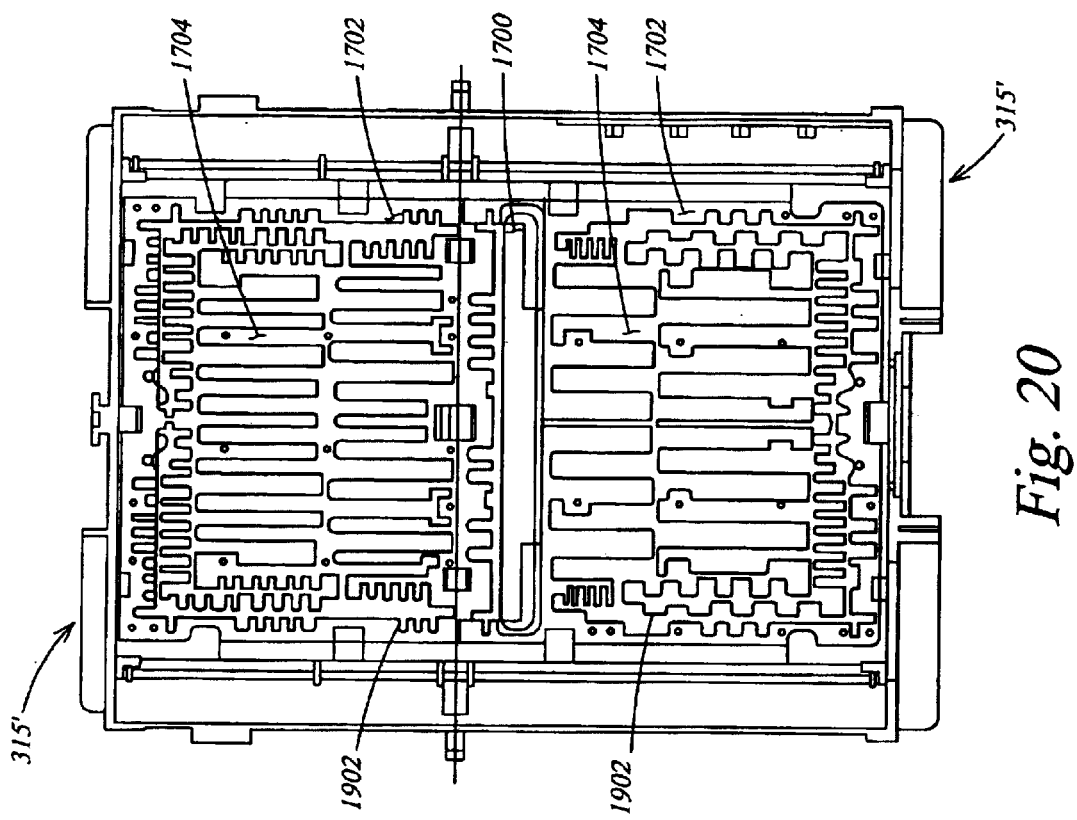
FIG. 20 illustrates two secondary heaters that each employ a resistive heater element and that may be coupled together within the upper and lower sections of the heating chamber.

FIG. 19 illustrates an exemplary embodiment of the secondary heater 315' of FIG. 17. With reference to FIG. 19, the secondary heater 315' includes a resistive heater element 1902 that forms a continuous, serpentine path throughout the heater 315'. More than one resistive heater element may be employed, as may separate resistive heater elements for the first and second heater regions 1702, 1704. As shown in FIG. 19, the resistive heater element 1902 has more bends and/or turns within the first heater region 1702 than within the second heater region 1704 so as to form an effective higher per unit area heater element density within the first heater region 1702 relative to the second heater region 1704. Accordingly, when electrical power is supplied to the resistive heater element 1902, more heating occurs within the first heater region 1702 than within the second heater region 1704. As described further below, through proper manipulation of heating of the first heater region 1702 and the second heater region 1704, a highly uniform substrate heating process may be performed within the heating chamber 140, 140'. Such a process provides uniform heating even for large substrates (e.g., 730 mm×920 mm or larger). FIG. 20 illustrates two secondary heaters 315' that each employ a resistive heater element 1902 and that may be coupled together within the upper and lower sections 215, 217 of the heating chamber 140, 140'.

The resistive heater elements 1902 may be similar to the heating element 717 of FIGS. 7 and 8, and may comprise, for example, stainless steel, nickel or another similar material. Each resistive heater element 1902 may be disposed within one or more layers of conducting material (not shown), similar to jacket 319 in FIGS. 7 and 8, such as aluminum, nickel, stainless steel or the like adapted to absorb heat from the resistive heater element 1902 and uniformly radiate the absorbed heat toward the substrate cassette 310. In at least one embodiment, the top conducting layer comprises a cobalt based or other high emissivity material (e.g., compared to nickel or stainless steel) so as to improve radiation efficiency and/or uniformity of the heater 315'. All or a portion of the secondary heater 315' also may be coated with a high emissivity material, such as a ceramic coating, to further increase radiation efficiency and/or uniformity. For example, one or both of the first and second heater regions 1702, 1704 may include a high emissivity coating. Preferably at least the outermost coating/layer of the secondary heater 315' is process resistant and generally free of contaminates (e.g., copper). Such heaters are available commercially, for example, from Watlow, Inc., under the name "thick film heater." Any suitable heater element pattern may be employed.

In one exemplary embodiment of the invention in which the heating chamber 140, 140' is employed to heat glass substrates having a dimension of about 730 mm×920 mm, each secondary heater 315' is configured such that the first heater region 1702 produces about a 20% higher Watt density than the second heater region 1704. Other Watt density variations between the first and second heater regions 1702, 1704 may employed. As stated, the first heater region 1702 extends into the secondary heater 315' a distance D from each edge $E_{1-3}$ of the secondary heater 315' (FIG. 17).

In one embodiment for 730 mm×920 mm substrates, the distance D that the first heater region 1702 extends from each edge $E_{1-3}$ of the first heater region 1702 is about 5 inches, and the width of the second heater region 1704 is about 24.4 inches (such that the overall width of the secondary heater 315' is about 34.4 inches). In this embodiment, the ratio of the distance D of the first heater region 1702 to the overall heater width is approximately $5/_{35}=1/_7$. In at least one embodiment of the invention, this ratio is maintained if the heating chamber 140, 140' is configured to heat other size substrates. For example, if the heating chamber 140, 140' is configured to heat 1460 mm×1840 mm substrates, the distance D may be about 10 inches and the overall heater width may be about 70 inches (with the first/edge heater region 1702 of the heater 315' producing about 20% higher Watt density than the second heater region 1704).

The height the secondary heater 315' will depend on the height of the upper or lower section 215, 217 in which the heater is employed. Other heater dimensions, and other dimensions for the first and second heater regions 1702, 1704 may be employed.

In at least one embodiment, the secondary heaters 315' are positioned a distance of about 2 inches from each sidewall of the upper and lower sections 215, 217 of the heating chamber 140, 140', and about 1.7 inches from the substrate cassette 310. Other distances may be employed.

By increasing heating along the edges of the secondary heaters 315' (e.g., first heater region 1702) relative to the central region of the secondary heaters 315' (e.g., second heater region 1704), and/or by employing a high emissivity coating such as a ceramic on the secondary heaters 315', a highly uniform temperature profile may be achieved within the heating chamber 140, 140'. For example, the present inventors have achieved a +/−1.5° C. temperature variation over a 730×920 mm substrate (having a mean temperature of about 518° C.) employing both increased edge heating and a ceramic coating.

While foregoing is directed to the embodiments of the invention, other and further embodiments of the invention may be devised without departing from the basic scope thereof, and the scope thereof is determined by the claims that follow.

The invention claimed is:

1. An apparatus for heating substrates, comprising:
a chamber having a bottom portion and a top portion;
a plurality of heated supports disposed within the chamber to support at least two substrates thereon; and
a heater disposed within the chamber between a sidewall of the chamber and the plurality of substrate supports and having an edge region and a center region, the heater adapted to produce more heat within the edge region than within the center region,
wherein the heater is further adapted and disposed to provide a heating profile substantially matching a substrate heat loss profile.

2. The apparatus of claim 1 further comprising one or more resistive heater elements disposed within, the heater.

3. The apparatus of claim 1 wherein the plurality of heated supports comprise a plurality of heating elements.

4. The apparatus of claim 1 wherein the heater is coated with a high emissivity material.

5. The apparatus of claim 1 wherein the edge region of the heater produces about a 20% higher Watt density than the center region of the heater.

6. The apparatus of claim 1 wherein the chamber is adapted to maintain a temperature profile of about +/−1.5° C. or less at a process temperature of greater than about 450° C.

7. The apparatus of claim 1 wherein the plurality of supports are adapted to support substrates having a dimension of at least 730 mm×920 mm.

8. The apparatus of claim 7 wherein the chamber is adapted to maintain a temperature profile of about +/−1.5° C. or less at a process temperature of greater than about 450° C.

9. A method for heating substrates, comprising:
providing an apparatus having:
  a chamber having a bottom portion and a top portion;
  a plurality of heated supports disposed within the chamber to support at least two substrates thereon; and
  a heater disposed within the chamber between a sidewall of the chamber and the plurality of substrate supports and having an edge region and a center region, the heater adapted to produce more heat within the edge region than within the center region; and
employing the apparatus to heat a substrate by generating a heating profile substantially matching a substrate heat loss profile.

10. The method of claim 9 further comprising maintaining a temperature profile within the chamber of about +/−1.5° C. or less at a process temperature of greater than about 450° C.

11. A method for heating substrates, comprising:
supporting a plurality of substrates on a plurality of heated supports within a chamber slightly larger than and shaped to conform to a shape of the plurality of heated supports; providing a process temperature of between about 450° C. and 600° C.;
providing a vacuum within the chamber; and
heating the substrates with at least one secondary heater positioned adjacent the plurality of heated supports by generating a heating profile substantially matching a substrate heat loss profile.

12. The method of claim 11, further comprising maintaining a temperature profile within the chamber of about +/−1.5° C. or less at a process temperature of greater than about 450° C.

13. The method of claim 11, further comprising maintaining a temperature profile within the chamber of about +/−1.5° C. or less at a process temperature of between about 450° C. and about 600° C.

14. The method of claim 11, further comprising providing a process gas within the chamber at a pressure of about 0.5 torr or below.

15. The method of claim 14, wherein the process gas is nitrogen.

16. An apparatus for heating substrates comprising:
a chamber having an upper section and a lower section;
a cassette having a plurality of heated supports adapted to store a plurality of substrates within the chamber; and
a plurality of heaters adapted to generate a heating profile substantially matching a substrate heat loss profile.

17. A method for heating substrates comprising:
providing a cassette for storing a plurality of substrates within a chamber, wherein the chamber has upper and lower sections;
supporting the plurality of substrates on a plurality of heated supports within the cassette;
providing a process temperature of between about 450° C. and about 600° C.;
employing the plurality of heated supports to heat the plurality of substrates; and
while employing the plurality of heated supports to heat the plurality of substrates, employing a plurality of heaters to generate a heating profile substantially matching a substrate heat loss profile.

18. The method of claim 17 further comprising maintaining a temperature profile within the chamber of about +/−5° C. or less at a process temperature of greater than about 450° C.

19. The method of claim 18 further comprising maintaining a temperature profile within the chamber of about +/−1.5° C. or less at a process temperature of greater than about 450° C.

20. The method of claim 18 wherein maintaining a temperature profile within the chamber includes maintaining a temperature profile within the chamber of about +/−1.5° C. or less at a process temperature of between about 450° C. and about 600° C.

21. The method of claim 17 wherein providing a cassette for storing a plurality of substrates within a chamber includes providing a cassette for storing a plurality of substrates of a size of at least 730 mm×920 mm.

22. An apparatus for heating substrates comprising:
a chamber comprising:
  an upper section; and
  a lower section coupled to the upper section;
  wherein the upper section and lower section define a cavity adapted to hold a plurality of substrates therein;
a cassette having a plurality of heated supports disposed within the cavity adapted to support and heat the plurality of substrates;
one or more heaters positioned within the cavity so as to provide heat to the cassette by generating a heating profile substantially matching a substrate heat loss profile; and
a heat reflector disposed within the cavity and surrounding at least a portion of the heated supports to form a reflective surface directed into the cavity.

23. The apparatus of claim 22 further comprising a loading window located in the lower section.

24. The apparatus of claim 22 wherein the one or more heaters are coated with a high emissivity material.

25. The apparatus of claim 22 further comprising a connecting body that couples the upper section and the lower section.

26. The apparatus of claim 25 wherein the connecting body includes a loading window.

27. The apparatus of claim 22 wherein the one or more heaters surround the cassette within at least one of the lower section and the upper section.

28. The apparatus of claim 22 wherein the one or more heaters are coupled to one or more sidewalls of at least one of the lower section and the upper section.

29. The apparatus of claim 22 wherein at least one to the heaters includes an opening adapted to align with a loading window so as to allow a substrate to be loaded into and out of the cassette.

30. The apparatus of claim 22 wherein at least one of the heaters includes a first heater region and a second heater region.

31. The apparatus of claim 30 wherein the first heater region extends into the second heater region a distance from each of a plurality of edges of the at least one heater.

32. The apparatus of claim 31 wherein one edge of the at least one heater is included in the second heater region.

33. The apparatus of claim 30 wherein the first heater region is configured to provide more heat than the second heater region.

34. The apparatus of claim 30 wherein the at least one heater Includes one or more resistive heater elements that form a continuous, serpentine path throughout the at least one heater.

35. The apparatus of claim 34 wherein the one or more resistive heater elements include more turns within the first heater region than within the second heater region so as to form a higher per unit area heater element density within the first heater region relative to the second heater region.

36. The apparatus of claim 34 wherein the one or more resistive heater elements are disposed within one or more layers of conducting material adapted to absorb heat from the one or more resistive heater elements and radiate the absorbed heat toward the cassette.

37. The apparatus of claim 33 wherein the first heater region produces about a 20% higher Watt density than the second heater region.

38. The apparatus of claim 22 wherein the cassette is adapted to support substrates having a dimension of at least about 730 mm×920 mm.

39. A method for uniformly heating substrates comprising:
providing an apparatus for heating substrates having:
a chamber comprising:
an upper section; and
a lower section coupled to the upper section;
wherein the upper section and lower section define a cavity adapted to hold a plurality of substrates therein;
a cassette having a plurality of heated supports disposed within the cavity adapted to support and heat the plurality of substrates;
one or more heaters positioned within the cavity so as to provide heat to the cassette by generating a heating profile substantially matching a substrate heat loss profile; and
a heat reflector disposed within the cavity and surrounding at least a portion of the heated supports to form a reflective surface directed into the cavity; and
employing the apparatus for heating substrates.

40. The method of claim 39 wherein employing the apparatus for heating substrates includes:
increasing beating along edges of the one or more heaters relative to a central region of the one or more heaters; and
employing a high emissivity coating on the one or more heaters.

* * * * *